United States Patent
Olson et al.

(10) Patent No.: US 10,519,350 B2
(45) Date of Patent: *Dec. 31, 2019

(54) COPOLYMER INCLUDING ULTRAVIOLET LIGHT-ABSORBING GROUP AND COMPOSITIONS INCLUDING THE SAME

(71) Applicant: 3M INNOVATIVE PROPERTIES COMPANY, St. Paul, MN (US)

(72) Inventors: David B. Olson, Hudson, WI (US); Diane North, Inver Grove Heights, MN (US); Patricia M. Savu, Maplewood, MN (US); Eric M. Peterson, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/739,073

(22) PCT Filed: Jun. 23, 2016

(86) PCT No.: PCT/US2016/039033
§ 371 (c)(1),
(2) Date: Dec. 21, 2017

(87) PCT Pub. No.: WO2016/210140
PCT Pub. Date: Dec. 29, 2016

(65) Prior Publication Data
US 2018/0187053 A1    Jul. 5, 2018

Related U.S. Application Data
(60) Provisional application No. 62/184,784, filed on Jun. 25, 2015.

(51) Int. Cl.
| | | |
|---|---|---|
| *C08F 220/18* | (2006.01) | |
| *C09J 11/08* | (2006.01) | |
| *C09J 133/10* | (2006.01) | |
| *C09J 133/14* | (2006.01) | |
| *C09J 7/38* | (2018.01) | |
| *C08F 220/16* | (2006.01) | |

(Continued)

(52) U.S. Cl.
CPC ............... *C09J 11/08* (2013.01); *B32B 7/12* (2013.01); *B32B 27/08* (2013.01); *C08F 220/16* (2013.01); *C08F 220/18* (2013.01); *C09J 7/385* (2018.01); *C09J 133/10* (2013.01); *C09J 133/14* (2013.01); *H01L 31/02167* (2013.01); *C08F 2800/20* (2013.01); *C09J 2203/322* (2013.01); *C09J 2433/00* (2013.01); *H01L 31/0322* (2013.01); *H01L 31/03928* (2013.01)

(58) Field of Classification Search
CPC .. C08F 220/18; C08F 220/16; C08F 2800/20; C08F 2220/1858; C08F 2220/346; C08F 220/34; C09J 133/10; C09J 11/08; C09J 7/385; C09J 133/14; C09J 2203/322; C09J 2433/00; B32B 27/08; B32B 7/12; H01L 31/02167; H01L 31/03928; H01L 31/0322; C08L 33/14
See application file for complete search history.

(56) References Cited

U.S. PATENT DOCUMENTS

| | | |
|---|---|---|
| 2,803,615 A | 8/1957 | Ahlbrecht |
| RE24,906 E | 12/1960 | Ulrich |

(Continued)

FOREIGN PATENT DOCUMENTS

| | | |
|---|---|---|
| CS | 231209 | 10/1984 |
| EP | 0870778 | 10/1998 |

(Continued)

OTHER PUBLICATIONS

Bahadur, et al. Principles of Polymer Science. Alpha Science International Ltd. 2002. Section 3.3. pp. 110-120. (Year: 2002).

(Continued)

*Primary Examiner* — Nathan M Nutter

(57) ABSTRACT

A copolymer that includes first divalent units having a pendent ultraviolet absorbing group, second divalent units represented by formula (I):, and third divalent units represented by formula (II):. Each $R^1$ is independently hydrogen or methyl; $R^2$ is a straight-chain or branched alkyl having from 1 to 20 carbon atoms; V is O or NH; W is alkylene having from 1 to 10 carbon atoms; and each R' is independently alkyl having from 1 to 6 carbon atoms. Compositions including the copolymer, for example, pressure sensitive adhesive compositions are disclosed. Articles including the compositions are disclosed. For example, an assembly including a barrier film and the pressure sensitive adhesive composition is also disclosed.

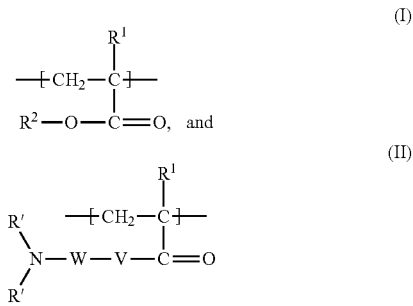

20 Claims, No Drawings

(51) Int. Cl.
*H01L 31/0216* (2014.01)
*B32B 7/12* (2006.01)
*B32B 27/08* (2006.01)
*H01L 31/032* (2006.01)
*H01L 31/0392* (2006.01)

(56) References Cited

U.S. PATENT DOCUMENTS

| | | |
|---|---|---|
| 3,423,360 A | 1/1969 | Helmut Huber et al. |
| 3,553,179 A | 1/1971 | Bartlett |
| 4,330,590 A | 3/1982 | Vesley |
| 4,329,384 A | 5/1982 | Vesley |
| 4,379,201 A | 4/1983 | Heilmann |
| 4,508,882 A | 4/1985 | Yoshida et al. |
| 4,696,719 A | 9/1987 | Bischoff |
| 4,722,515 A | 2/1988 | Ham |
| 4,737,559 A | 4/1988 | Kellen |
| 4,804,717 A | 2/1989 | Ramey et al. |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,073,611 A | 12/1991 | Rehmer |
| 5,084,537 A | 1/1992 | Stoyan |
| 5,097,800 A | 3/1992 | Shaw |
| 5,125,138 A | 6/1992 | Shaw |
| 5,157,091 A | 10/1992 | Masataka |
| 5,198,498 A | 3/1993 | Valet |
| 5,254,608 A | 10/1993 | McClure |
| 5,286,781 A | 2/1994 | Gotoh |
| 5,324,834 A | 6/1994 | Borzatta |
| 5,420,204 A | 5/1995 | Valet |
| 5,440,446 A | 8/1995 | Shaw |
| 5,540,978 A | 7/1996 | Schrenk |
| 5,547,908 A | 8/1996 | Furuzawa |
| 5,672,704 A | 9/1997 | Toan |
| 5,723,513 A | 3/1998 | Bonham |
| 5,807,635 A | 9/1998 | Cogen |
| 5,986,011 A | 11/1999 | Ellis |
| 6,045,864 A | 4/2000 | Lyons |
| 6,214,422 B1 | 4/2001 | Yializis |
| 6,231,939 B1 | 5/2001 | Shaw |
| 6,251,521 B1 | 6/2001 | Eian |
| 6,261,676 B1 | 7/2001 | Olson |
| 6,312,802 B1 | 11/2001 | Nishida |
| 6,335,102 B1 | 1/2002 | Tsubaki |
| 6,352,778 B1 | 3/2002 | Gillette |
| 6,414,236 B1 | 7/2002 | Kataoka |
| 6,500,887 B1 | 12/2002 | Tobita |
| 6,524,686 B2 | 2/2003 | Strassel |
| 6,582,790 B2 | 6/2003 | Olson |
| 6,664,354 B2 | 12/2003 | Savu |
| 6,777,079 B2 | 8/2004 | Zhou |
| 6,923,921 B2 | 8/2005 | Flynn |
| 7,018,713 B2 | 3/2006 | Padiyath |
| 7,101,618 B2 | 9/2006 | Coggio |
| 7,236,290 B1 | 6/2007 | Zhang |
| 7,682,771 B2 | 3/2010 | Liu et al. |
| 7,935,772 B2 | 5/2011 | Makuda |
| 7,993,680 B2 | 8/2011 | Clemente |
| 8,628,859 B2 | 1/2014 | Weigel |
| 8,722,791 B2 | 5/2014 | Saito |
| 9,254,506 B2 | 2/2016 | Roehrig |
| 9,371,471 B2 | 6/2016 | Palasz |
| 9,441,135 B2 | 9/2016 | Klun et al. |
| 9,670,300 B2 * | 6/2017 | Olson .................. C08F 220/22 |
| 10,125,251 B2 | 11/2018 | Olson et al. |
| 2003/0012912 A1 | 1/2003 | Olson |
| 2004/0191550 A1 | 9/2004 | Maekawa |
| 2005/0129569 A1 | 6/2005 | Zhao et al. |
| 2005/0277729 A1 | 12/2005 | Tsunemine |
| 2007/0166562 A1 | 7/2007 | Swei |
| 2007/0276107 A1 | 11/2007 | Wada |
| 2009/0104447 A1 | 4/2009 | Kita |
| 2009/0202792 A1 | 8/2009 | Truog |
| 2009/0283144 A1 | 11/2009 | Hebrink |
| 2010/0055418 A1 | 3/2010 | Takamatsu |
| 2010/0189983 A1 | 7/2010 | Numrich |
| 2011/0065826 A1 | 3/2011 | Shimohara |
| 2011/0151229 A1 | 6/2011 | Morita |
| 2011/0297228 A1 | 12/2011 | Li |
| 2012/0003448 A1 | 1/2012 | Weigel |
| 2012/0003451 A1 | 1/2012 | Weigel |
| 2012/0003484 A1 | 1/2012 | Roehrig |
| 2012/0011850 A1 | 1/2012 | Hebrink |
| 2012/0097220 A1 | 4/2012 | Miyashita |
| 2012/0227809 A1 | 9/2012 | Bharti |
| 2013/0096273 A1 | 4/2013 | Benz |
| 2014/0120268 A1 | 5/2014 | Akiyama et al. |
| 2015/0086782 A1 | 3/2015 | Kase |
| 2015/0337096 A1 * | 11/2015 | Olson .................. C08F 220/24 525/200 |
| 2016/0200884 A1 | 7/2016 | Konokawa |
| 2017/0198177 A1 * | 7/2017 | Olson et al. ............. B32B 27/42 |

FOREIGN PATENT DOCUMENTS

| | | |
|---|---|---|
| EP | 0939441 | 9/1999 |
| EP | 1065731 | 1/2001 |
| EP | 1311637 | 5/2003 |
| EP | 2102254 | 9/2009 |
| GB | 1407670 | 9/1975 |
| JP | 51-76345 | 7/1976 |
| JP | 09239921 | 9/1978 |
| JP | S56163140 A | 12/1981 |
| JP | 4216807 | 8/1992 |
| JP | H04311754 A | 11/1992 |
| JP | H06-299132 | 10/1994 |
| JP | 7-3242 | 1/1995 |
| JP | 7-310061 | 11/1995 |
| JP | H08188737 | 7/1996 |
| JP | 9-52916 | 2/1997 |
| JP | 9-59560 | 3/1997 |
| JP | 9-239921 | 9/1997 |
| JP | 10-7998 | 1/1998 |
| JP | 10-53681 | 2/1998 |
| JP | 1998-130456 | 5/1998 |
| JP | 10-168408 | 6/1998 |
| JP | 10-279832 | 10/1998 |
| JP | 11-293180 | 10/1999 |
| JP | 11-293181 | 10/1999 |
| JP | 11-348199 | 12/1999 |
| JP | 2000-123621 | 4/2000 |
| JP | 2000-154497 | 6/2000 |
| JP | 2001-1478 | 1/2001 |
| JP | 2001-19895 | 1/2001 |
| JP | 2001-123107 | 5/2001 |
| JP | 2001-323209 | 11/2001 |
| JP | 2002-60575 | 2/2002 |
| JP | 2002-146155 | 5/2002 |
| JP | 2002-194266 | 7/2002 |
| JP | 2002-201420 | 7/2002 |
| JP | 2002-256217 | 9/2002 |
| JP | 2003-40937 | 2/2003 |
| JP | 2003-129033 | 5/2003 |
| JP | 2003-238887 | 8/2003 |
| JP | 2003-266449 | 9/2003 |
| JP | 2004-148542 | 5/2004 |
| JP | 2004-161800 | 6/2004 |
| JP | 2004-217695 | 8/2004 |
| JP | 2005-042019 | 2/2005 |
| JP | 2005-187662 | 7/2005 |
| JP | 2005-290269 | 10/2005 |
| JP | 2007-204678 | 8/2007 |
| JP | 2007-297619 | 11/2007 |
| JP | 2010-126690 | 6/2010 |
| JP | 2011-68708 | 4/2011 |
| JP | 2012-72333 | 4/2012 |
| JP | 2012-111811 | 8/2012 |
| JP | 2012-188620 | 10/2012 |
| KR | 2006-0130397 | 12/2006 |
| KR | 20070047863 | 5/2007 |
| KR | 2009-0089088 | 8/2009 |
| KR | 2014-0074581 | 6/2014 |

(56) References Cited

FOREIGN PATENT DOCUMENTS

| WO | WO 2000-26973 | 5/2000 |
| WO | WO 2005/047384 | 5/2005 |
| WO | WO 2005-058377 | 6/2005 |
| WO | WO 2006-071981 | 7/2006 |
| WO | WO 2008-076101 | 6/2008 |
| WO | WO 2011/013638 | 2/2011 |
| WO | WO 2011-071847 | 6/2011 |
| WO | WO 2011-113008 | 9/2011 |
| WO | WO 2013-096543 | 6/2013 |
| WO | WO 2013-172930 | 11/2013 |
| WO | WO 2014-025983 | 2/2014 |
| WO | WO 2014/029344 | 2/2014 |
| WO | WO 2015-200669 | 12/2015 |

OTHER PUBLICATIONS

Affinito, "Polymer-Oxide Transparent Barrier Layers", Society of Vacuum Coaters, 39th Annual Technical Conference Proceedings, 1996, pp. 392-397.
Affinito, "Vacuum deposited polymer/metal multilayer films for optical application", Thin Solid Films, 1995, vol. 270, pp. 43-48.
Pickett, "UV Absorber Permanence and Coating Lifetimes", Journal of Testing and Evaluation, May 2004, vol. 32, No. 3, pp. 1-6.
Roehrig, "Use of Evaporated Acrylate Coatings to Smooth the Surface of Polyester and Polypropylene Film Substrates", Journal of Plastic Film & Sheeting, Jul. 1997, vol. 13, pp. 235-251.
Shaw, "A New High Speed Process for Vapor Depositing Acrylate Thin Films: An Update", Society of Vacuum Coaters, 36th Annual Technical Conference Proceedings, Apr. 25-30, 1993, pp. 348-352.
Shaw, "A New Vapor Deposition Process for Coating Paper and Polymer Webs", 6th International Vacuum Coating Conference in Reno, Oct. 28, 1992, pp. 18-24.
Shaw, "Use of Vapor Deposited Acrylate Coatings to Improve the Barrier Properties of Metallized Film", Society of Vacuum Coaters, 37th Annual Technical Conference Proceedings, 1994, pp. 240-247.
International Search Report for PCT International Application No. PCT/US2016/039033, dated Aug. 22, 2016, 5pgs.

\* cited by examiner

COPOLYMER INCLUDING ULTRAVIOLET LIGHT-ABSORBING GROUP AND COMPOSITIONS INCLUDING THE SAME

CROSS-REFERENCE TO RELATED APPLICATION

This application is a national stage filing under 35 U.S.C. 371 of PCT/US2016/039033, filed Jun. 23, 2016, which claims priority to U.S. Provisional Application No. 62/184,784, filed Jun. 25, 2015, the disclosure of which are incorporated by reference in its entirety herein.

BACKGROUND

It may be desirable to incorporate ultraviolet absorbers (UVAs) into materials exposed to ultraviolet (UV) radiation, for example, to protect from UV degradation. Some UVAs can be dispersed into some compositions, but sometimes they can be lost due to volatilization or migration to the surface. Covalent incorporation of UVAs into pressure sensitive adhesive (PSA) compositions has been proposed (see JP2012188620, published Oct. 4, 2012). Certain copolymers made from monomers having UV absorbing groups have been described for including in PSA compositions (see, JP2000123621, published Apr. 28, 2000).

SUMMARY

The present disclosure provides a copolymer having a first divalent unit with a pendent ultraviolet absorbing group, a second divalent unit with a pendent alkyl group, and a third divalent unit with a pendent tertiary amine. The copolymers are surprisingly compatible with pressure sensitive adhesives, for example, as determined by evaluation of haze, and do not migrate out of the adhesive. Compositions including the pressure sensitive adhesive and copolymers provide protection from ultraviolet light and have good transparency to visible and infrared light. These properties are typically well-maintained even after accelerated UV exposure and exposure to high temperature and humidity conditions.

In one aspect, the present disclosure provides a copolymer that includes a first divalent unit having a pendent ultraviolet absorbing group, a second divalent unit represented by formula:

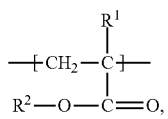

and a third divalent unit represented by formula:

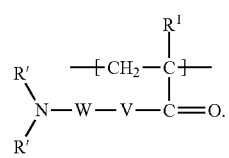

In these formulas, each $R^1$ is independently hydrogen or methyl, $R^2$ is a straight-chain or branched alkyl having from 1 to 20 carbon atoms, V is O or NH, W is alkylene having from 1 to 10 carbon atoms, and each R' is independently alkyl having from 1 to 6 carbon atoms.

In another aspect, the present disclosure provides composition comprising a blend of a pressure sensitive adhesive and the copolymer described above in which $R^2$ is a straight-chain or branched alkyl having from 4 to 20 carbon atoms. In some embodiments, the pressure sensitive adhesive is an acrylic pressure sensitive adhesive comprising the second divalent unit.

The composition including the pressure sensitive adhesive and the copolymer may be useful, for example, for adhering a film to a surface of an article or adhering any two surfaces together. Accordingly, in another aspect, the present disclosure provides an article that includes the composition. The article may be, for example, photovoltaic device or a film with the composition disposed on at least a portion of a surface thereof. The film may be, for example, a vehicle wrap, graphic film, anti-graffiti film, architectural film, window film, or barrier film.

In another aspect, the present disclosure provides an assembly including a first polymeric film substrate having a first surface and a second surface opposite the first surface, a barrier film disposed on the first surface of the first polymeric film, a pressure sensitive adhesive layer comprising the composition described above disposed on the barrier film opposite the first polymeric film substrate, with the first surface of the pressure sensitive adhesive disposed on the barrier film opposite the first polymeric film substrate, and a second polymeric film substrate disposed on the second surface of the pressure sensitive adhesive layer.

UVAs in pressure sensitive adhesives (PSA) are useful for protecting both the PSA and underlying films or structures from UV light. With conventional UVAs, there can be issues with migration out of the adhesive layer as well as agglomeration and resulting optical defects. The ultraviolet light-absorbing oligomers disclosed herein have superior compatibility in PSA formulations when compared to commercially available UVAs of the same class as evidenced by clarity and transmission of the PSAs. Furthermore, unexpectedly superior compatibility with certain PSAs, as evidenced by haze evaluation, is observed for the copolymers disclosed herein in comparison to similar copolymers having the same first and second divalent units.

In this application:

Terms such as "a", "an" and "the" are not intended to refer to only a singular entity, but include the general class of which a specific example may be used for illustration. The terms "a", "an", and "the" are used interchangeably with the term "at least one".

The phrase "comprises at least one of" followed by a list refers to comprising any one of the items in the list and any combination of two or more items in the list. The phrase "at least one of" followed by a list refers to any one of the items in the list or any combination of two or more items in the list.

The term "ultraviolet absorbing group" or ultraviolet light-absorbing group refers to a covalently attached ultraviolet absorber (UVA). UVAs are known to those skilled in the art as being capable of dissipating absorbed light energy from UV rays as heat by reversible intramolecular proton transfer. UVAs are selected such that the oligomers in any of the embodiments of oligomers or second oligomers disclosed herein absorbs at least 70%, 80%, or 90% of incident light in a wavelength range from 180 nanometers (nm) to 400 nm.

"Alkyl group" and the prefix "alk-" are inclusive of both straight chain and branched chain groups and of cyclic groups. Unless otherwise specified, alkyl groups herein have up to 20 carbon atoms. Cyclic groups can be monocyclic or polycyclic and, in some embodiments, have from 3 to 10 ring carbon atoms.

The phrase "interrupted by at least one —O— group", for example, with regard to an alkyl (which may or may not be fluorinated), alkylene, or arylalkylene refers to having part of the alkyl, alkylene, or arylalkylene on both sides of the —O— group. For example, —CH$_2$CH$_2$—O—CH$_2$—CH$_2$— is an alkylene group interrupted by an —O—.

The term "copolymer" refers to a molecule having a structure which essentially includes the multiple repetition of units derived, actually or conceptually, from molecules of low relative molecular mass. The term "copolymer" encompasses oligomers.

All numerical ranges are inclusive of their endpoints and nonintegral values between the endpoints unless otherwise stated (e.g., 1 to 5 includes 1, 1.5, 2, 2.75, 3, 3.80, 4, 5, etc.).

DETAILED DESCRIPTION

Ultraviolet light-absorbing copolymers useful in the compositions according to the present disclosure are linear or branched. Typically, they are linear oligomers. They may be random copolymers or block copolymers. They are not covalently crosslinked. Accordingly, they may be dissolved in solvents and have measurable molecular weights as opposed to covalently crosslinked polymers, which cannot be dissolved in solvents and have molecular weights approaching infinity. In some embodiments, the copolymers may be considered thermoplastic. Thermoplastics are typically melt-processable such as by an extrusion process. In some embodiments, copolymers according to the present disclosure have a number average molecular weight of up to 150,000 grams per mole. In some of these embodiments, the copolymer has a number average molecular weight of up to 120,000, 100,000, 90,000, 80,000, 70,000, 60,000, 50,000, 40,000, 30,000, 20,000, or less than 20,000 grams per mole (e.g., up to 19,500, 19,000, or 18,500 grams per mole). In some embodiments, the number average molecular weight of the copolymer may be at least 1000 grams per mole, greater than 5,000 grams per mole, or greater than 7,500 grams per mole. Useful ultraviolet light-absorbing copolymers typically have a distribution of molecular weights and compositions. Weight and number average molecular weights can be measured, for example, by gel permeation chromatography (i.e., size exclusion chromatography) using techniques known to one of skill in the art.

Ultraviolet light-absorbing copolymers according to the present disclosure in any of their embodiments include a first divalent unit comprising a pendent ultraviolet absorbing (UVA) group. Any class of UVA may be useful for providing the UVA group. Examples of useful classes include benzophenones, benzotriazoles, triazines, cinnamates, cyanoacrylates, dicyano ethylenes, salicylates, oxanilides, and para-aminobenzoates. In some of these embodiments, the pendent ultraviolet absorbing group comprises a triazine, a benzophenone, or a benzotriazole. In some embodiments of the compositions according to the present disclosure, the pendent ultraviolet absorbing group is a triazine. In some embodiments, the pendent ultraviolet absorbing group has enhanced spectral coverage in the long-wave UV region (e.g., 315 nm to 400 nm), enabling it to block the high wavelength UV light that can cause yellowing in polymers. The first divalent unit can be considered to be a repeating unit in the ultraviolet-absorbing copolymer.

In some of embodiments of the copolymers or compositions of the present disclosure, the first divalent unit may be represented by formula -[—CH$_2$—C(H)UVA-]-, -[—CH$_2$—C(H)C(O)—O—X—UVA-]-, -[—CH$_2$—C(H)C(O)—NH—X—UVA-]-, -[—CH$_2$—C(CH$_3$)C(O)—O—X—UVA-]-, or -[—CH$_2$—C(CH$_3$)C(O)—NH—X—UVA-]-, wherein X is a bond or an alkylene or alkyleneoxy group having from 1 to 10 (in some embodiments, 2 to 6 or 2 to 4) carbon atoms and optionally interrupted by one or more —O— groups and optionally substituted by a hydroxyl group, and wherein UVA includes any of the above embodiments of UVA groups. In the alkyleneoxy group, the oxygen is attached to the UVA group. The oligomer may include (e.g., at least 2, 3, 4, 5, 6, 7, 8, 9, 10, 15, or at least 20 up to 30, 35, 40, 45, 50, 100, 200, or up to 500 or more) of these repeating units, independently selected. The repeating unit can be derived from a substituted vinyl, substituted acrylate, or substituted methacrylate group. In some of these embodiments, each first divalent unit is independently represented by formula:

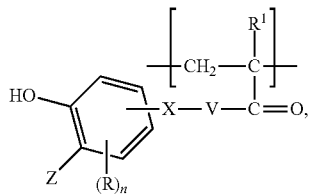

wherein each R$^1$ is independently hydrogen or methyl, V is O or NH, X is a bond or X is alkylene or alkyleneoxy group having from 1 to 10 (in some embodiments, 2 to 6 or 2 to 4) carbon atoms and optionally interrupted by one or more —O— groups and optionally substituted by a hydroxyl group, R is alkyl (e.g., having from one to four carbon atoms), n is 0 or 1, and Z is a benzoyl group, a 4,6-bisphenyl [1,3,5]triazin-2-yl group, or a 2H-benzotriazol-2-yl group, wherein the benzoyl group, 4,6-bisphenyl[1,3,5]triazin-2yl group, and 2H-benzotriazol2-yl group is optionally substituted by one or more alkyl, aryl, alkoxy, hydroxyl, or halogen substituents, or a combination of these substituents. In some embodiments, the alkyl and/or alkoxy substituent independently has 1 to 4 or 1 to 2 carbon atoms. In some embodiments, each halogen substituent is independently a chloro, bromo, or iodo group. In some embodiments, each halogen substituent is a chloro group. The term "aryl" as used herein includes carbocyclic aromatic rings or ring systems, for example, having 1, 2, or 3 rings and optionally containing at least one heteroatom (e.g., O, S, or N) in the ring. Examples of aryl groups include phenyl, naphthyl, biphenyl, fluorenyl as well as furyl, thienyl, pyridyl, quinolinyl, isoquinolinyl, indolyl, isoindolyl, triazolyl, pyrrolyl, tetrazolyl, imidazolyl, pyrazolyl, oxazolyl, and thiazolyl. In the alkyleneoxy group, the oxygen is attached to the substituted benzene ring. In some embodiments, each V is O, and X is ethylene, propylene, butylene, ethyleneoxy, propyleneoxy, or butyleneoxy, with the oxygen attached to the substituted benzene ring. In some embodiments, n is 0. In some embodiments, R is methyl, ethyl, n-propyl, isopropyl, n-butyl, isobutyl, s-butyl, or t-butyl, and n is 1. In some embodiments, Z is an unsubstituted benzoyl group. In some embodiments, Z is 4,6-bis(2,4-dimethylphenyl)[1,3,5]triazin-2-yl; 4,6-bis(2,4-diethylphenyl)[1,3,5]triazin-2-yl; 4,6-bis(2,4-dimethoxyphenyl)[1,3,5]triazin-2-yl; or 4,6-bis(2,4-diethoxyphenyl)[1,3,5]triazin-2-yl. In some embodiments, Z is 2H-benzotriazol-2-yl or 5-chloro-2H-benzotriazol-2-yl. In some embodiments, Z is 4,6-bisphenyl[1,3,5]triazin-2-yl. In some embodiments, at least some of the first divalent units in the ultraviolet light-absorbing copolymer comprise different Z groups.

In embodiments of the compositions disclosed herein in which the ultraviolet light-absorbing group is a triazine, at least some of the first divalent units may be represented by formula:

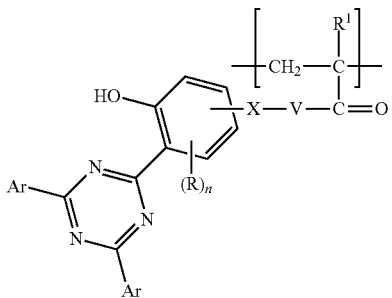

wherein R, $R^1$, X, and V are as described above in any of their embodiments, and wherein each Ar is a phenyl group optionally substituted by one or more alkyl, aryl, alkoxy, hydroxyl, or halogen substituents, or a combination of these substituents. In some embodiments, the alkyl and/or alkoxy substituent independently has 1 to 4 or 1 to 2 carbon atoms. In some embodiments, each halogen substituent is independently a chloro, bromo, or iodo group. In some embodiments, each halogen substituent is a chloro group. The aryl substituent is as defined above. In some embodiments, Ar is 2,4-dimethylphenyl; 2,4-diethylphenyl; 2,4-dimethoxyphenyl; or 2,4-diethoxyphenyl.

In embodiments of the compositions disclosed herein in which the ultraviolet light-absorbing group is a triazine, at least some of the first divalent unit may be represented by formula:

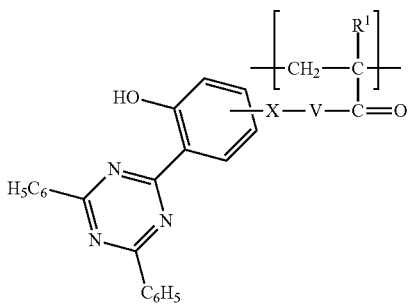

wherein $R^1$, X, and V are as described above in any of their embodiments.

Ultraviolet light-absorbing copolymers according to the present disclosure comprise at least one (e.g., at least 2, 3, 4, 5, 6, 7, 8, 9, 10, 15, or at least 20 up to 30, 35, 40, 45, 50, 100, 200, 500, 1000, or up to 1500 or more) second divalent unit independently represented by formula:

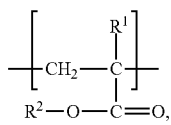

wherein each $R^1$ is independently hydrogen or methyl (in some embodiments, hydrogen, in some embodiments, methyl), and wherein each $R^2$ is independently alkyl having from 1 to 22 carbon atoms (in some embodiments, 1 to 20 carbon atoms). In some embodiments, each $R^2$ in the second divalent units is independently alkyl having from 4 to 22, 4 to 20, 4 to 18, 4 to 16, 4 to 12, or 6 to 12 carbon atoms. In some of these embodiments, $R^2$ has 8 carbon atoms (e.g., $R^2$ is ethylhexyl or isooctyl).

Ultraviolet light-absorbing copolymers according to the present disclosure comprise at least one (e.g., at least 2, 3, 4, 5, 6, 7, 8, 9, 10, 15, or at least 20 up to 30, 35, 40, 45, 50, 100, 200, 500, or up to 1000 or more) third divalent unit represented by formula:

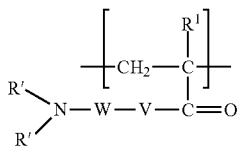

wherein each $R^1$ is independently hydrogen or methyl (in some embodiments, hydrogen, in some embodiments, methyl), V is O or NH (in some embodiments, O), W is alkylene having from 1 to 10 carbon atoms, and each $R'$ is independently alkyl having from 1 to 6 carbon atoms. In some embodiments, W is alkylene having from 1 to 8, 1 to 6, 2 to 6, 2 to 4, or 2 carbon atoms. In some embodiments, each $R'$ is independently 1 to 4, 2 to 6, or 2 to 4 carbon atoms. In some embodiments, each $R'$ is ethyl.

Copolymers according to the present disclosure can be prepared, for example, by polymerizing a mixture of components typically in the presence of an initiator. By the term "polymerizing" it is meant forming a polymer or oligomer that includes at least one identifiable structural element due to each of the components. Typically, preparing the ultraviolet light-absorbing copolymer includes combining components comprising at least a first monomer having an ultraviolet light-absorbing group, a second monomer having a pendent alkyl group, and a third monomer having a pendent tertiary amine, described below.

Suitable first monomers for some embodiments of the copolymers disclosed herein are those that include benzophenone, benzotriazole, triazine, cinnamate, cyanoacrylate, dicyano ethylene, salicylate, oxanilide, or para-aminobenzoate groups. Examples of suitable first monomers include 2-(cyano-β,β-biphenylacryloyloxy)ethyl-1-methacrylate, 2-(α-cyano-β,β-biphenylacryloyloxy)ethyl-2-methacrylamide, N-(4-methacryloylphenol)-N'-(2-ethylphenyl)oxamide, vinyl 4-ethyl-α-cyano-β-phenylcinnamate, 2-hydroxy-4-(2-hydroxy-3-methacryloyloxypropoxy)benzophenone, 2-hydroxy-4-methacryloyloxybenzophenone, 2-hydroxy-4-(2-acryloyloxyethoxy)benzophenone, 2-hydroxy-4-(4-acryloyloxybutoxy)benzophenone, 2,2'-dihydroxy-4-(2-acryloyloxyethoxy)benzophenone, 2-hydroxy-4-(2-acryloyloxyethoxy)-4'-(2-hydroxyethoxy)benzophenone, 4-(allyloxy)-2-hydroxybenzophenone, 2-(2'-hydroxy-3'-methacrylamidomethyl-5'-octylphenyl)benzotriazole, 2-(2-hydroxy-5-vinylphenyl)-2-benzotriazole, 2-(2H-benzotriazol-2-yl)-4-methyl-6-(2-propenyl)phenol, 2-(2'-hydroxy-5'-methacryloyloxyethylphenyl)-2H-benzotriazole, 2-(2'-hydroxy-5'-methacryloyloxyethylphenyl)-5-chloro-2H-benzotriazole, 2-(2'-hydroxy-5'-methacryloyloxypropylphenyl)-2H-benzotriazole, 2-(2'-hydroxy-5'-methacryloyloxypropylphenyl)-5-chloro-2H- benzotriazole, 2-(2'-hydroxy-3'-tert-butyl-5'-methacryloyloxyethylphenyl)-2H-benzotriazole, 2-(2'-hydroxy-3'-tert-butyl-5'-methacryloyloxyethylphenyl)-5-chloro-2H-benzotriazole, 2,4-diphenyl-6-[2-hydroxy-4-(2-acryloyloxyethoxy)]-1,3,5-triazine, 2,4-bis(2-methylphenyl)-6-[2-hydroxy-4-(2-acryloyloxyethoxy)]-1,3,5-triazine, 2,4-bis(2-methoxyphenyl)-6-[2-hydroxy-4-(2-acryloyloxyethoxy)]-1,3,5-triazine, 2,4-bis(2-ethylphenyl)-6-[2-hydroxy-4-(2-acryloyloxyethoxy)]-1,3,5-triazine, 2,4-bis(2-ethoxyphenyl)-6-[2-hydroxy-4-(2-acryloyloxyethoxy)]-1,3,5-triazine, 2,4-diphenyl-6-[2-hydroxy-4-(2-methacryloyloxyethoxy)]-1,3,5-triazine, 2,4-bis(2-methylphenyl)-6-[2-hydroxy-4-(2-methacryloyloxyethoxy)]-1,3,5-triazine, 2,4-bis(2-methoxyphenyl)-6-[2-hydroxy-4-(2-methacryloyloxyethoxy)]-1,3,5-triazine, 2,4-bis(2-ethylphenyl)-6-[2-hydroxy-4-(2-methacryloyloxyethoxy)]-1,3,5-triazine, 2,4-bis(2-ethoxyphenyl)-6-[2-hydroxy-4-(2-methacryloyloxyethoxy)]-1,3,5-triazine, 2,4-bis(2,4-dimethoxyphenyl)-6-[2-hydroxy-4-(2-acryloyloxyethoxy)]-1,3,5-triazine, 2,4-bis(2,4-dimethylphenyl)-6-[2-hydroxy-4-(2-acryloyloxyethoxy)]-1,3,5-triazine, 2,4-bis(2,4-diethoxyphenyl)-6-[2-hydroxy-4-(2-acryoyloxyethoxy)]-1,3,5-triazine, 2,4-bis (2,4-diethylphenyl)-6-[2-hydroxy-4-(2-acryloyloxyethoxy)]-1,3,5-triazine, methacrylates of the foregoing acrylates and acrylates of the foregoing methacrylates. Combinations of these first monomers may be used to prepare the copolymer. In some embodiments, the first monomer includes a triazine, a benzophenone, or a benzotriazole group. In these embodiments, the first monomer can be any of the monomers including a triazine, benzophenone, or benzotriazole group listed above. In some embodiments of the composition according to the present disclosure, the first monomer includes a triazine group. In these embodiments, the first monomer can be any of the monomers including a triazine group listed above.

Many of these first monomers can be obtained commercially from a variety of chemical suppliers. Others can be prepared by treating a UVA having an available hydroxyl group (e.g., other than a phenolic hydroxyl group ortho to a triazine, benzoyl, or benzotriazole group) with (meth)acrylic acid or an equivalent thereof using conventional esterification methods. The term (meth)acrylic refers to both acrylic and methacrylic. In the case of a UVA having an available phenol group (e.g., other than a phenolic hydroxyl group ortho to a triazine, benzoyl, or benzotriazole group), the phenol group may be treated with ethylene carbonate or ethylene oxide to form a hydroxyethyl group that can then be treated with (meth)acrylic acid or an equivalent thereof using conventional esterification methods.

The copolymer according to the present disclosure is prepared by including at least one compound represented by formula $R^2-O-C(O)-C(R')=CH_2$ as the second monomer in the components to be polymerized. $R^1$ and $R^2$ are as defined above in any of their embodiments. Suitable second monomers of this formula include methyl methacrylate, ethyl acrylate, propyl acrylate, butyl acrylate, isoamyl acrylate, ethylhexyl acrylate, isooctyl acrylate, nonyl acrylate, dodecyl acrylate, hexadecyl methacrylate, octadecyl methacrylate, stearyl acrylate, behenyl methacrylate, acrylates of the foregoing methacrylates and methacrylates of the foregoing acrylates. Many of these second monomers are available, for example, from several chemical suppliers (e.g., Sigma-Aldrich Company, Milwaukee, Wis.; VWR International, West Chester, Pa.; Monomer-Polymer & Dajac Labs, Festerville, Pa.; Avocado Organics, Ward Hill, Mass.; and Ciba Specialty Chemicals, Basel, Switzerland) or may be synthesized by conventional methods. Some of these second monomers are available as single isomers (e.g., straight-chain isomer) of single compounds. Other are available, for example, as mixtures of isomers (e.g., straight-chain and branched isomers), mixtures of compounds (e.g., hexadecyl acrylate and octadecylacrylate), and combinations thereof.

The copolymer according to the present disclosure is prepared by including at least one compound represented by formula $(R')_2-W-V-C(O)-C(R^1)=CH_2$ as the third monomer in the components to be polymerized. Suitable third monomers include N,N-diethylaminoethyl methacrylate, N-(3-dimethylaminopropyl)methacrylamide, N,N-dimethylaminoethyl methacrylate, N,N-dimethylaminopropyl methacrylate, and acrylates and acrylamides of the foregoing methacrylates and methacrylamides.

In some embodiments, the ultraviolet light-absorbing oligomer according to the present disclosure and/or useful in the compositions according to the present disclosure is represented by formula:

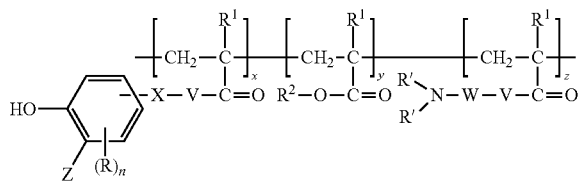

In this formula, X, V, Z, n, R, R', $R^1$, $R^2$, and W are as defined above in any of their embodiments, x is in a range from 1 to 500 or more, y is in a range from 1 to 1500 or more, and z is in a range from 1 to 1000 or more, or x, y, and z are any of the ranges described above. It should be understood that the representation of the order of the divalent units in this formula is for convenience only and not meant to specify that the copolymers are block copolymers. Random copolymers having first, second, and third divalent units are also included in the representation.

The polymerization reaction for making the oligomers useful in the compositions according to the present disclosure can be carried out in the presence of an added free-radical initiator. Free radical initiators such as those widely known and used in the art may be used to initiate polymerization of the components. Examples of suitable free-radical initiators include azo compounds (e.g., 2,2'-azobisisobutyronitrile (AIBN), 2,2'-azobis(2-methylbutyronitrile), or azo-2-cyanovaleric acid), hydroperoxides (e.g., cumene, tert-butyl or tert-amyl hydroperoxide), dialkyl peroxides (e.g., di-tert-butyl or dicumylperoxide), peroxyesters (e.g., tert-butyl perbenzoate or di-tert-butyl peroxyphthalate), and diacylperoxides (e.g., benzoyl peroxide or lauryl peroxide).

The free-radical initiator may also be a photoinitiator. Examples of useful photoinitiators include benzoin ethers (e.g., benzoin methyl ether or benzoin butyl ether); acetophenone derivatives (e.g., 2,2-dimethoxy-2-phenylacetophenone or 2,2-diethoxyacetophenone); 1-hydroxycyclohexyl phenyl ketone; and acylphosphine oxide derivatives and acylphosphonate derivatives (e.g., bis(2,4,6-trimethylbenzoyl)phenylphosphine oxide, diphenyl-2,4,6-trimethylbenzoylphosphine oxide, isopropoxyphenyl-2,4,6-trimethylbenzoylphosphine oxide, or dimethyl pivaloylphosphonate). Many photoinitiators are available, for examples, from BASF, Florham Park, N.J., under the trade designation "IRGACURE". The photoinitiator may be selected so that the wavelength of light required to initiate polymerization is not absorbed by the ultraviolet absorbing group.

In some embodiments, the polymerization reaction is carried out in solvent. The components may be present in the reaction medium at any suitable concentration, (e.g., from about 5 percent to about 80 percent by weight based on the total weight of the reaction mixture). Illustrative examples of suitable solvents include aliphatic and alicyclic hydrocarbons (e.g., hexane, heptane, cyclohexane), aromatic solvents (e.g., benzene, toluene, xylene), ethers (e.g., diethyl ether, glyme, diglyme, and diisopropyl ether), esters (e.g., ethyl acetate and butyl acetate), alcohols (e.g., ethanol and isopropyl alcohol), ketones (e.g., acetone, methyl ethyl ketone and methyl isobutyl ketone), halogenated solvents (e.g., methylchloroform, 1,1,2-trichloro-1,2,2-trifluoroethane, trichloroethylene, trifluorotoluene, and hydrofluoroethers available, for example, from 3M Company, St. Paul, Minn. under the trade designations "HFE-7100" and "HFE-7200"), and mixtures thereof.

Polymerization can be carried out at any temperature suitable for conducting an organic free-radical reaction. Temperature and solvent for a particular use can be selected by those skilled in the art based on considerations such as the solubility of reagents, temperature required for the use of a particular initiator, and desired molecular weight. While it is not practical to enumerate a particular temperature suitable for all initiators and all solvents, generally suitable temperatures are in a range from about 30° C. to about 200° C. (in some embodiments, from about 40° C. to about 100° C., or from about 50° C. to about 80° C.).

Free-radical polymerizations may be carried out in the presence of chain transfer agents. Typical chain transfer agents that may be used in the preparation compositions according to the present invention include hydroxyl-substituted mercaptans (e.g., 2-mercaptoethanol, 3-mercapto-2-butanol, 3-mercapto-2-propanol, 3-mercapto-1-propanol, and 3-mercapto-1,2-propanediol (i.e., thioglycerol)); poly(ethylene glycol)-substituted mercaptans; carboxy-substituted mercaptans (e.g., mercaptopropionic acid or mercaptoacetic acid); amino-substituted mercaptans (e.g., 2-mercaptoethylamine); difunctional mercaptans (e.g., di(2-mercaptoethyl)sulfide); and aliphatic mercaptans (e.g., octylmercaptan, dodecylmercaptan, and octadecylmercaptan).

Adjusting, for example, the concentration and activity of the initiator, the concentration of each of the reactive monomers, the temperature, the concentration of the chain transfer agent, and the solvent using techniques known in the art can control the molecular weight of the oligomer.

The weight ratio of the first divalent units, second divalent units, and third divalent units in the oligomers disclosed herein in any of their embodiments may vary. For example, the first divalent units may be present in the ultraviolet light-absorbing oligomer in a range from 5 to 50 (in some embodiments, 10 to 40 or 10 to 30) percent, based on the total weight of the oligomer. The second divalent units may be present in a range from 5 to 95 percent, based on the total weight of the oligomer. In some embodiments, the second divalent unit is present in the oligomer in an amount of up to 90, 80, 75, or 70 percent by weight, based on the total weight of the oligomer. Third divalent units may be present in a range from 1 to 20, 1.5 to 15, 2 to 15, 1 to 10, or 1 to 15 percent by weight, based on the total weight of the copolymer. When the third divalent units are present at least than 1% by weight, based on the total weight of the copolymer, the copolymers may not be as compatibility with a PSA, depending on the particular first divalent unit(s) present in the copolymer and the particular PSA.

While in some embodiments, the divalent units in the copolymer according to the present disclosure consist of the first, second, and third divalent units, in other embodiments, further divalent units may be present. For example, N-vinyl pyrrolidone and N-vinyl caprolactam may also be useful in the preparation of the copolymers disclosed herein. Divalent units including a pendent hydroxyalkyl group may be useful. Such divalent units may be incorporated by including a hydroxyalkyl (meth)acrylate (e.g., 2-hydroxyethyl acrylate or methacrylate, 3-hydroxypropyl acrylate or methacrylate, 4-hydroxybuyl acrylate or methacrylate, 8-hydroxyocyl acrylate or methacrylate, or 9-hydroxynonyl acrylate or methacrylate) in the components to be copolymerized.

As shown in the Examples, below, in some cases incorporating pendent carboxylic acid or aminocarbonyl groups into copolymers including first and second divalent units provides copolymers with inferior compatibility with a pressure sensitive adhesive (e.g., including pendent carboxylic acid groups) than the copolymers according to the present disclosure. Accordingly, in some embodiments, copolymers according to the present disclosure are free of pendent carboxylic acid and/or aminocarbonyl groups. In these embodiments, monomers such as acrylic acid, methacrylic acid, itaconic acid, maleic acid, and fumaric acid, acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, N-ethyl-N-dihydroxyethyl acrylamide, and methacrylamides of the foregoing acrylamides are not included in the components to be copolymerized.

While in some embodiments, a pendent tetramethylpiperidinyl group may be useful in the copolymers according to the present disclosure as a hindered amine light stabilizer, in some embodiments, such groups can cause incompatibility with a pressure sensitive adhesive. In some embodiments, copolymers according to the present disclosure are free of divalent units having tetramethylpiperidinyl groups, for example, independently represented by formula:

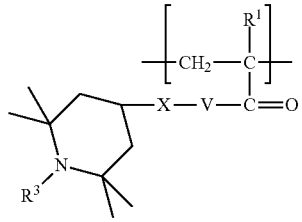

wherein each $R^1$ is independently hydrogen or methyl, V is O or NH, X is a bond or X is alkylene or alkyleneoxy group having from 1 to 10 (in some embodiments, 2 to 6 or 2 to 4) carbon atoms and optionally interrupted by one or more —O— groups and optionally substituted by a hydroxyl group, and $R^3$ is hydrogen, alkyl, oxy, alkoxy (that is, —O-alkyl with the oxygen atom attached to the nitrogen atom), or alkanone (that is, —C(O)-alkyl with the carbonyl group attached to the nitrogen atom).

In some embodiments, the composition according to the present disclosure includes a blend of a pressure sensitive adhesive and the ultraviolet light-absorbing oligomer(s). By "blend" it should be understood that the pressure sensitive adhesive and the ultraviolet light-absorbing oligomer(s) are distinct components. They are generally not covalently bonded to each other. Ultraviolet light-absorbing monomers grafted onto a PSA do not constitute a blend of the PSA and the oligomer(s) as disclosed herein.

Ultraviolet light-absorbing oligomers as described above in any of their embodiments are incorporated into pressure sensitive adhesives compositions. PSAs are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power.

One method useful for identifying pressure sensitive adhesives is the Dahlquist criterion. This criterion defines a pressure sensitive adhesive as an adhesive having a 1 second creep compliance of greater than $1 \times 10^{-6}$ cm$^2$/dyne as described in "Handbook of Pressure Sensitive Adhesive Technology", Donatas Satas (Ed.), 2nd Edition, p. 172, Van Nostrand Reinhold, New York, N.Y., 1989. Alternatively, since modulus is, to a first approximation, the inverse of creep compliance, pressure sensitive adhesives may be defined as adhesives having a storage modulus of less than about $1 \times 10^6$ dynes/cm$^2$.

Examples of useful classes PSAs that may include the ultraviolet light-absorbing oligomers according to the present disclosure include acrylic, silicone, polyisobutylene, urea, natural rubber, synthetic rubber such as an ABA triblock copolymer of styrene or substituted styrene as the A blocks and polybutadiene, hydrogenated polybutadiene, polyisoprene, hydrogenated polyisoprene, or a combination of thereof as the B block, and combinations of these classes. Some useful commercially available PSAs into which the ultraviolet light-absorbing oligomer according to the present disclosure can be incorporated include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172", and "OPTICALLY CLEAR LAMINATING ADHESIVE 8172P".

In some embodiments, the PSA composition into which the ultraviolet light-absorbing oligomer according to the present disclosure can be incorporated does not flow and has sufficient barrier properties to provide slow or minimal infiltration of oxygen and moisture through the adhesive bond line. Also, the PSA composition may be generally transmissive to visible and infrared light such that it does not interfere with transmission of visible light, for example, through a window film or absorption of visible light, for example, by photovoltaic cells. The PSAs may have an average transmission over the visible portion of the spectrum of at least about 75% (in some embodiments at least about 80, 85, 90, 92, 95, 97, or 98%) measured along the normal axis. In some embodiments, the PSA has an average transmission over a range of 400 nm to 1400 nm of at least about 75% (in some embodiments at least about 80, 85, 90, 92, 95, 97, or 98%) measured along the normal axis.

In some embodiments, useful PSA compositions disclosed herein have a modulus (tensile modulus) up to 50,000 psi ($3.4 \times 10^8$ Pa). The tensile modulus can be measured, for example, by a tensile testing instrument such as a testing system available from Instron, Norwood, Mass., under the trade designation "INSTRON 5900". In some embodiments, the tensile modulus of the PSA is up to 40,000, 30,000, 20,000, or 10,000 psi ($2.8 \times 10^8$ Pa, $2.1 \times 10^8$ Pa, $1.4 \times 10^8$ Pa, or $6.9 \times 10^8$ Pa).

In some embodiments, PSAs compositions that include the ultraviolet light-absorbing oligomer according to the present disclosure are acrylic PSAs. As used herein, the term "acrylic" or "acrylate" includes compounds having at least one of acrylic or methacrylic groups. Useful acrylic PSAs can be made, for example, by combining at least two different monomers including certain of the second monomers described above. Examples of suitable second monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, isononyl acrylate, and methacrylates of the foregoing acrylates. Examples of suitable additional monomers useful for preparing acrylic PSAs include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, N-ethyl-N-dihydroxyethyl acrylamide, and methacrylamides of the foregoing acrylamides), a (meth)acrylate (e.g., 2-hydroxyethyl acrylate or methacrylate, cyclohexyl acrylate, t-butyl acrylate, isobornyl acrylate, and methacrylates of the foregoing acrylates), N-vinyl pyrrolidone, N-vinyl caprolactam, an alpha-olefin, a vinyl ether, an allyl ether, a styrenic monomer, or a maleate. In some embodiments, the PSA in the composition according to the present disclosure includes a pendent carboxylic acid group incorporated into the PSA by including, for example, acrylic acid, methacrylic acid, itaconic acid, maleic acid, or fumaric acid in the preparation of the PSA.

In some embodiments, the pressure sensitive adhesive is an acrylic pressure sensitive adhesive comprising the second divalent unit, and wherein for at least some of the second divalent units in the pressure sensitive adhesive $R^2$ is alkyl having the same number of carbon atoms as at least some of the second divalent units in the ultraviolet light-absorbing oligomer. For example, for a PSA based on isooctyl acrylate, it can be useful for the ultraviolet light-absorbing oligomer to include second divalent units in which $R^2$ is alkyl having 8 carbon atoms. Matching the $R^2$ groups in the second divalent units of the PSA and the ultraviolet light-absorbing oligomer can improve compatibility between the PSA and the oligomer, resulting in higher light transmission and clarity in the PSA composition. Although using methyl methacrylate copolymers with the first monomers described above to make oligomers for incorporating into PSAs has been described (see, JP2000123621, published Apr. 28, 2000), we have found that these type of oligomers can result in lower clarity in PSA compositions than when the ultraviolet light-absorbing oligomer includes divalent units that match those in the PSA (see Table 1 in the Examples of application 62/017,666 (Olson et al.), filed on Jun. 26, 2014).

Acrylic PSAs may also be made by including cross-linking agents in the formulation. Examples of cross-linking agents include copolymerizable polyfunctional ethylenically unsaturated monomers (e.g., 1,6-hexanediol diacrylate, trimethylolpropane triacrylate, pentaerythritol tetraacrylate, and 1,2-ethylene glycol diacrylate); ethylenically unsaturated compounds which in the excited state are capable of abstracting hydrogen (e.g., acrylated benzophenones such as described in U.S. Pat. No. 4,737,559 (Kellen et al.), p-acryloxy-benzophenone, which is available from Sartomer Company, Exton, Pa., monomers described in U.S. Pat. No. 5,073,611 (Rehmer et al.) including p-N-(methacryloyl-4-oxapentamethylene)-carbamoyloxybenzophenone, N-(benzoyl-p-phenylene)-N'-(methacryloxymethylene)-carbodiimide, and p-acryloxy-benzophenone); nonionic crosslinking agents which are essentially free of olefinic unsaturation and is capable of reacting with carboxylic acid groups, for example, in the third monomer described above (e.g., 1,4-bis(ethyleneiminocarbonylamino)benzene; 4,4-bis(ethyleneiminocarbonylamino)diphenylmethane; 1,8-bis(ethyleneiminocarbonylamino)octane; 1,4-tolylene diisocyanate; 1,6-hexamethylene diisocyanate, N,N'-bis-1,2-propyleneisophthalamide, diepoxides, dianhydrides, bis(amides), and bis(imides)); and nonionic crosslinking agents which are essentially free of olefinic unsaturation, are noncopymerizable with the first and second monomers, and, in the excited state, are capable of abstracting hydrogen (e.g., 2,4-bis(trichloromethyl)-6-(4-methoxy)phenyl)-s-triazine; 2,4-bis(trichloromethyl)-6-(3,4-dimethoxy)phenyl)-s-triazine; 2,4-bis(trichloromethyl)-6-(3,4,5-trimethoxy)phenyl)-s-triazine; 2,4-bis(trichloromethyl)-6-(2,4-dimethoxy)phenyl)-s-triazine; 2,4-bis(trichloromethyl)-6-(3-methoxy)phenyl)-s-triazine as described in U.S. Pat. No. 4,330,590 (Vesley); 2,4-bis(trichloromethyl)-6-naphthenyl-s-triazine and 2,4-bis(trichloromethyl)-6-(4-methoxy)naphthenyl-s-triazine as described in U.S. Pat. No. 4,329,384 (Vesley)).

Typically, the second monomer is used in an amount of 80-100 parts by weight (pbw) based on a total weight of 100 parts of copolymer, and an additional monomer as described above is used in an amount of 0-20 pbw based on a total weight of 100 parts of copolymer. The crosslinking agent can be used in an amount of 0.005 to 2 weight percent based on the combined weight of the monomers, for example from about 0.01 to about 0.5 percent by weight or from about 0.05 to 0.15 percent by weight.

The acrylic PSAs useful for practicing the present disclosure can be prepared, for example, in solvent or by a solvent free, bulk, free-radical polymerization process (e.g., using heat, electron-beam radiation, or ultraviolet radiation). Such polymerizations are typically facilitated by a polymerization initiator (e.g., a photoinitiator or a thermal initiator). Examples of suitable polymerization initiators include an of those described above for the preparation of the ultraviolet light-absorbing oligomer. The polymerization initiator is used in an amount effective to facilitate polymerization of the monomers (e.g., 0.1 part to about 5.0 parts or 0.2 part to about 1.0 part by weight, based on 100 parts of the total monomer content).

If a photocrosslinking agent is used, the coated adhesive can be exposed to ultraviolet radiation having a wavelength of about 250 nm to about 400 nm. The radiant energy in this range of wavelength required to crosslink the adhesive is about 100 millijoules/cm$^2$ to about 1,500 millijoules/cm2, or more specifically, about 200 millijoules/cm$^2$ to about 800 millijoules/cm$^2$.

A useful solvent-free polymerization method is disclosed in U.S. Pat. No. 4,379,201 (Heilmann et al.). Initially, a mixture of second and third monomers can be polymerized with a portion of a photoinitiator by exposing the mixture to UV radiation in an inert environment for a time sufficient to form a coatable base syrup, and subsequently adding a crosslinking agent and the remainder of the photoinitiator. This final syrup containing a crosslinking agent (e.g., which may have a Brookfield viscosity of about 100 centipoise to about 6000 centipoise at 23° C., as measured with a No. 4 LTV spindle, at 60 revolutions per minute) can then be coated onto a substrate, for example, a polymeric film substrate. Once the syrup is coated onto the substrate, for example, the polymeric film substrate, further polymerization and crosslinking can be carried out in an inert environment (e.g., nitrogen, carbon dioxide, helium, and argon, which exclude oxygen). A sufficiently inert atmosphere can be achieved by covering a layer of the photoactive syrup with a polymeric film, such as silicone-treated PET film, that is transparent to UV radiation or e-beam and irradiating through the film in air.

PSAs generally include high molecular weight polymers. In some embodiments, the acrylic polymer in the pressure sensitive adhesive in the composition according to the present disclosure has a number average molecular weight of at least 300,000 grams per mole. Number average molecular weights lower than 300,000 grams per mole may produce PSAs with low durability. In some embodiments, the number average molecular weight of the PSA is in the range from 300,000 to 3 million, 400,000 to 2 million, 500,000 to 2 million, or 300,000 to 1 million grams per mole. Accordingly, in some embodiments, the ultraviolet light-absorbing oligomer has a number average molecular weight of up to one half the number average molecular weight of the pressure sensitive adhesive. In some embodiments, the ultraviolet light-absorbing oligomer has a number average molecular weight of up to one-third, one-fifth, or one-tenth the number average molecular weight of the pressure sensitive adhesive.

It can be useful to have a mixture of different ultraviolet light-absorbing copolymers in the compositions according to the present disclosure. In some embodiments, the composition comprises at least two different ultraviolet light-absorbing copolymers in the blend, each ultraviolet light-absorbing oligomer independently comprising the first divalent unit, the second divalent unit, and the third divalent unit. Each ultraviolet light-absorbing oligomer may independently comprise a triazine, a benzophenone, or a benzotriazole. It may be useful for two different ultraviolet light-absorbing oligomers to have two different types of pendent ultraviolet absorbing group. In these embodiments, the first divalent units in the ultraviolet light-absorbing oligomer and in the second, different ultraviolet light-absorbing oligomer comprise different ultraviolet absorbing groups. In any of these embodiments, the second, different ultraviolet-light absorbing oligomer can comprise at least one (e.g., at least 2, 3, 4, 5, 6, 7, 8, 9, 10, 15, or at least 20 up to 30, 35, 40, 45, 50, 100, 200, 500, 1000, or up to 1500 or more) second divalent unit, at least one (e.g., at least 2, 3, 4, 5, 6, 7, 8, 9, 10, 15, or at least 20 up to 30, 35, 40, 45, 50, 100, 200, or up to 500 or more) first divalent unit, and at least one (e.g., at least 2, 3, 4, 5, 6, 7, 8, 9, 10, 15, or at least 20 up to 30, 35, 40, 45, 50, 100, 200, 500, or up to 1000 or more) third divalent unit. The first, second, and third divalent units may be as described in any of the embodiments described above for the ultraviolet light-absorbing copolymer. The mixture of two different ultraviolet-light absorbing oligomers may be useful to improve compatibility or durability in some cases.

Other stabilizers may be added to the compositions according to the present disclosure to improve resistance to UV light. Examples of these include hindered amine light stabilizers (HALS) and anti-oxidants. Some suitable HALS include a tetramethylpiperidine group, in which the nitrogen atoms on the piperidine may be unsubstituted or substituted by alkyl or acyl. Suitable HALS include decanedioic acid, bis (2,2,6,6-tetramethyl-1-(octyloxy)-4-piperidinyl)ester, bis(2,2,6,6-tetramethyl-4-piperidyl)sebacate, 8-acetyl-3-dodecyl-7,7,9,9-tetramethyl-1,3,8-triazaspiro(4,5)-decane-2,5- dione, bis(2,2,6,6-tetramethyl-4-hydroxypiperidine succinate), and bis(N-methyl-2,2,6,6-tetramethyl-4-piperidyl) secacate. Suitable HALS include those available, for example, from BASF under the trade designations "CHIMASSORB". Exemplary anti-oxidants include those obtained under the trade designations "IRGAFOS 126", "IRGANOX 1010" and "ULTRANOX 626", available from BASF, Florham Park, N.J. These stabilizers, if present, can be included in the compositions according to the present disclosure in any effective amount, typically up to 5, 2, to 1 percent by weight based on the total weight of the composition and typically at least 0.1, 0.2, or 0.3 percent by weight. Calcite may also be a useful additive in some compositions, for example, to protect against corrosion of processing equipment not made of corrosion resistant steel.

In some embodiments of the composition or methods of making the composition or the film, the composition is essentially free of volatile organic solvent. Volatile organic solvents are typically those have a boiling point of up to 150° C. at atmospheric pressure. Examples of these include esters, ketones, and toluene. "Essentially free of volatile organic solvent" can mean that volatile organic solvent may be present (e.g., from a previous synthetic step or in a commercially available monomer) in an amount of up to 2.5 (in some embodiments, up to 2, 1, 0.5, 0.1, 0.05, or 0.01) percent by weight, based on the total weight of the composition. Advantageously, compositions disclosed herein and their films can be made without the expensive manufacturing step of removing organic solvent.

The compositions according to the present disclosure can include the ultraviolet light-absorbing oligomer and optionally the second ultraviolet light-absorbing oligomer in a range of useful amounts. For example, the ultraviolet light-absorbing oligomer may be present in the composition at up to about 25 percent by weight, based on the total weight of the composition. When two or more different ultraviolet light-absorbing oligomers are present, the two or more are present in the composition in an amount up to 25 percent combined weight, based on the total weight of the composition. Useful amounts of the ultraviolet light-absorbing oligomer(s) may be in a range from 1 to 25, 2 to 20, 3 to 15, or 4 to 10 percent by weight, based on the total weight of the composition. Useful amounts of the ultraviolet absorbing groups (in other words, active UVA) may be in a range from 0.5 to 20, 0.5 to 15, 0.5 to 10, 1 to 7.5, or 2 to 5 percent by weight, based on the total weight of the composition.

In some embodiments, compositions according to the present disclosure are transmissive to both visible and infrared light. The term "transmissive to visible and infrared light" as used herein can mean having an average transmission over the visible and infrared portion of the spectrum of at least about 75% (in some embodiments at least about 80, 85, or 90, 92, 95, 97, or 98%) measured along the normal axis. In some embodiments, the composition has an average transmission over a range of 400 nm to 1400 nm of at least about 75% (in some embodiments at least about 80, 85, 90, 92, 95, 97, or 98%) measured along the normal axis.

Compositions according to the present disclosure may be useful for a variety of outdoor applications. For example, the compositions according to the present disclosure may be useful, for example, as a PSA layer on traffic or other signs, other graphic films, anti-graffiti films, automotive exteriors, roofing materials or other architectural films, barrier films, or window films.

Compositions according to the present disclosure are useful, for example, in solar devices. In some embodiments, the composition (e.g., in any embodiment in the form of a film) is disposed on, above, or around a photovoltaic cell. Accordingly, the present disclosure provides a photovoltaic device including the composition disclosed herein in which the composition is used as a PSA in a photovoltaic device. Photovoltaic devices include photovoltaic cells that have been developed with a variety of materials each having a unique absorption spectrum that converts solar energy into electricity. Each type of semiconductor material has a characteristic band gap energy which causes it to absorb light most efficiently at certain wavelengths of light, or more precisely, to absorb electromagnetic radiation over a portion of the solar spectrum. The compositions according to the present disclosure typically do not interfere with absorption of visible and infrared light, for example, by photovoltaic cells. In some embodiments, the composition has an average transmission over a range wavelengths of light that are useful to a photovoltaic cell of at least about 75% (in some embodiments at least about 80, 85, 90, 92, 95, 97, or 98%) measured along the normal axis. Examples of materials used to make solar cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi-junction (about 350 nm to about 1750 nm). The shorter wavelength left absorption band edge of these semiconductor materials is typically between 300 nm and 400 nm. Organic photovoltaic cells may also be useful. One skilled in the art understands that new materials are being developed for more efficient solar cells having their own unique longer wavelength absorption band-edge. In some embodiments, the photovoltaic device including the composition according to the present disclosure includes a CIGS cell. In some embodiments, the photovoltaic device to which the assembly is applied comprises a flexible film substrate.

A composition according to the present disclosure can be used as a PSA in a barrier stack (see, e.g., U.S. Pat. Appl. Pub. No. 2012/0227809 (Bharti et al. and U.S. Pat. Appl. Pub. No. 2012/0003451 (Weigel et al.), incorporated herein by reference.

In some embodiments, the present disclosure provides an assembly including a first polymeric film substrate having a first surface and a second surface opposite the first surface, a barrier film disposed on the first surface of the first polymeric film, a pressure sensitive adhesive layer having a first surface and a second surface opposite the first surface, wherein the first surface of the pressure sensitive adhesive is disposed on the barrier film opposite the first polymeric film substrate; and a second polymeric film substrate disposed on the second surface of the pressure sensitive adhesive layer. The pressure sensitive adhesive can be as described in any of the aforementioned embodiments and includes at least one ultraviolet light-absorbing oligomer as described in any of the aforementioned embodiments.

The term "barrier film" refers to films that provide a barrier to at least one of oxygen or water. Barrier films are typically selected such that they have oxygen and water transmission rates at a specified level as required by the application. In some embodiments, the barrier film according to the present disclosure and/or made according to the method of the present disclosure has a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the barrier film has a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the barrier film has an oxygen transmission rate of less than about 0.005 g/m$^2$/day at 23° C. and 90% relative humidity; in some embodiments, less than about 0.0005 g/m$^2$/day at 23° C. and 90% relative humidity; and in some embodiments, less than about 0.00005 g/m$^2$/day at 23° C. and 90% relative humidity.

In some embodiments of the assembly disclosed herein, the barrier film comprises at least first and second polymer layers separated by an inorganic barrier layer. In some embodiments, an inorganic layer, which may be an oxide layer, can be applied over the second polymer layer. In some embodiments, the barrier film comprises a plurality of alternating layers of the oxide layer and the second polymer layer on the first polymer layer. The oxide layer and second polymer layer together form a "dyad", and in some embodiments, the barrier film can include more than one dyad. Each of the oxide layers and/or second polymer layers in the multilayer barrier film including more than one dyad can be the same or different. An optional inorganic layer, which may be an oxide layer, can be applied over the plurality of alternating layers or dyads. In some embodiments, inorganic layers comprise at least one of silicon aluminum oxide or indium tin oxide.

The first and second polymer layers can include any polymer suitable for deposition in a thin film. In some embodiments, the first and second polymer layer can be formed from various precursors, for example, acrylate or methacrylate monomers and/or oligomers that include acrylates or methacrylates. In some embodiments of the barrier film and the method disclosed herein, at least one of the first or second polymer layer precursor comprises a methacrylate or acrylate monomer. Examples of useful methacrylate and acrylate precursors include urethane acrylates, isobornyl acrylate, isobornyl methacrylate, dipentaerythritol pentaacrylates, epoxy acrylates, epoxy acrylates blended with styrene, di-trimethylolpropane tetraacrylates, diethylene glycol diacrylates, 1,3-butylene glycol diacrylate, pentaacrylate esters, pentaerythritol tetraacrylates, pentaerythritol triacrylates, ethoxylated (3) trimethylolpropane triacrylates, ethoxylated (3) trimethylolpropane triacrylates, alkoxylated trifunctional acrylate esters, dipropylene glycol diacrylates, neopentyl glycol diacrylates, ethoxylated (4) bisphenol A dimethacrylates, cyclohexane dimethanol diacrylate esters, isobornyl methacrylate, cyclic diacrylates and tris (2-hydroxy ethyl) isocyanurate triacrylate, acrylates of the foregoing methacrylates and methacrylates of the foregoing acrylates. Further examples of useful acrylate or methacrylate precursors include trimethylolpropane triacrylate, trimethylolpropane diacrylate, hexanediol diacrylate, ethoxyethyl acrylate, phenoxyethyl acrylate, cyanoethyl (mono)acrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2,2,2-trifluoromethyl acrylate, and methacrylates of any of these acrylates.

The first and second polymer layers can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the substrate.

The monomer or oligomer can also be applied to the substrate using conventional coating methods such as roll coating (e.g., gravure roll coating) or spray coating (e.g., electrostatic spray coating), then crosslinked as set out above. The first and second polymer layers can also be formed by applying a layer containing an oligomer or polymer in solvent and drying the thus-applied layer to remove the solvent. Chemical Vapor Deposition (CVD) may also be employed in some cases.

In some embodiments, at least one of the first or second polymer layers comprises a polymerized (e.g., cross-linked) acrylate or methacrylate. In some of these embodiments, the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate), trimethylolpropane diacrylate, trimethylolpropane triacrylate, di-trimethylolpropane tetraacrylate, dipentaerythritol pentaacrylate, or combinations thereof.

Useful methods for flash evaporation and vapor deposition followed by crosslinking in situ, can be found, for example, in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in PCT International Publication No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

In some embodiments, amino-functional silanes can be added to at least one of the first or second polymer layers. Amino-functional silanes have been added to polymer layers to effectively improve adhesion between inorganic oxide layers and polymer layers in a multi-layer barrier film. Cyclic aza silanes have shown improved adhesion even up to 250 hours of aging at 85° C. and 85% relative humidity. See U.S. Pat. App. Pub. Nos. 2012-0003451 (Weigel et al.) and 2012-0003484 (Roehrig et al.), each incorporated by reference in its entirety herein. Secondary or tertiary amino-functional silane having at least two silane groups maintain adhesion and resist delamination after aging for 1000 hours at 85° C. and 85% relative humidity. See Int. Appl. Pub. No. WO2014/025983 (Spagnola et al.), incorporated by reference in its entirety herein. In some embodiments in which at least one of the first or second polymer layers comprises a polymerized (e.g., cross-linked) acrylate or methacrylate, the siloxane reaction product includes an amide bond that is formed from reaction between the amino group of the secondary or tertiary amino-functional silane and the acrylate or methacrylate.

The oxide layer typically comprises at least one inorganic oxide. Suitable inorganic materials that may also be included are nitrides, carbides or borides of different atomic elements. Examples of inorganic materials included in the oxide layer comprise oxides, nitrides, carbides or borides of atomic elements from Groups IIA, IIIA, IVA, VA, VIA, VIIA, IB, or IIB, metals of Groups IIIB, IVB, or VB, rare-earth metals, or combinations thereof. Examples of suitable inorganic materials include silicon oxides such as silica, aluminum oxides such as alumina, titanium oxides such as titania, indium oxides, tin oxides, indium tin oxide ("ITO"), tantalum oxide, zirconium oxide, niobium oxide, aluminum nitride, silicon nitride, boron nitride, aluminum oxynitride, silicon oxynitride, boron oxynitride, zirconium oxyboride, titanium oxyboride, and combinations thereof. ITO is an example of a special class of ceramic materials that can become electrically conducting with the proper selection of the relative proportions of each elemental constituent. In some embodiments, the oxide layer comprises at least one of silicon aluminum oxide or ITO. While the barrier films disclosed herein include at least one oxide layer between first and second polymer layers, in some embodiments, an inorganic layer, for example, an inorganic oxide layer, may be applied to the uppermost second polymer layer.

The oxide layer can be formed using techniques employed in the film metalizing art such as sputtering (e.g., cathode or planar magnetron sputtering), evaporation (e.g., resistive or electron beam evaporation), chemical vapor deposition, plating and the like. In some embodiments, the oxide layer is formed using sputtering, e.g., reactive sputtering. Enhanced barrier properties have been observed when the oxide layer is formed by a high energy deposition technique such as sputtering compared to lower energy techniques such as conventional chemical vapor deposition processes. Without being bound by theory, it is believed that the enhanced properties are due to the film-forming species arriving at the substrate with greater kinetic energy as occurs in sputtering, leading to a lower void fraction as a result of compaction.

In some embodiments, the sputter deposition process can use dual targets powered by an alternating current (AC) power supply in the presence of a gaseous atmosphere having inert and reactive gases, for example argon and oxygen, respectively. The AC power supply alternates the polarity to each of the dual targets such that for half of the AC cycle one target is the cathode and the other target is the anode. On the next cycle the polarity switches between the dual targets. This switching occurs at a set frequency, for example about 40 kHz, although other frequencies can be used. Oxygen that is introduced into the process forms oxide layers on both the substrate receiving the inorganic composition, and also on the surface of the target. The dielectric oxides can become charged during sputtering, thereby disrupting the sputter deposition process. Polarity switching can neutralize the surface material being sputtered from the targets, and can provide uniformity and better control of the deposited material.

In some embodiments, the sputter deposition process can use targets powered by direct current (DC) power supplies in the presence of a gaseous atmosphere having inert and reactive gasses, for example argon and oxygen, respectively. The DC power supplies supply power (e.g. pulsed power) to each cathode target independent of the other power supplies. In this aspect, each individual cathode target and the corresponding material can be sputtered at differing levels of power, providing additional control of composition through the layer thickness. The pulsing aspect of the DC power supplies is similar to the frequency aspect in AC sputtering, allowing control of high rate sputtering in the presence of reactive gas species such as oxygen. Pulsing DC power supplies allow control of polarity switching, can neutralize the surface material being sputtered from the targets, and can provide uniformity and better control of the deposited material.

The barrier film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.), each incorporated by reference in its entirety herein. The deposition of the layers can be in-line, and in a single pass through the system. In some cases, the barrier film can pass through the system several times, to form a multilayer barrier film having several dyads.

Examples of useful first polymeric film substrates onto which barrier films are disposed include thermoplastic polymeric films including, for example, polyesters, polyacrylates (e.g., polymethyl methacrylate), polycarbonates, polypropylenes, high or low density polyethylenes, polysulfones, polyether sulfones, polyurethanes, polyamides, polyvinyl butyral, polyvinyl chloride, fluoropolymers (e.g., polyvinylidene difluoride and polytetrafluoroethylene), polyethylene sulfide, olefinic copolymers such copolymers of ethylene and norbornene (e.g., available as "TOPAS COC" from Topas Advanced Polymers of Florence, Ky.), and thermoset films such as epoxies, cellulose derivatives, polyimide, polyimide benzoxazole, and polybenzoxazole.

In some embodiments, the first polymeric film substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In some embodiments, the first polymeric film substrate comprises at least one of polyethylene terephthalate (PET), polyethylene napthalate (PEN), heat stabilized PET, heat stabilized PEN, polyoxymethylene, polyvinylnaphthalene, polyetheretherketone, fluoropolymer, polycarbonate, polymethylmethacrylate, poly α-methyl styrene, polysulfone, polyphenylene oxide, polyetherimide, polyethersulfone, polyamideimide, polyimide, or polyphthalamide. In some embodiments, the substrate includes PET.

Heat-stabilization of the substrate may be carried out, for example, using heat setting, annealing under tension, or other techniques that will discourage shrinkage up to at least the heat stabilization temperature when the polymeric film is not constrained.

In some embodiments, the first polymeric film substrate is a multilayer optical film ("MOF"), such as those described in U.S. Pat. App. Pub. No. 2012-0003451 (Weigel et al.).

The substrate may have a variety of thicknesses, for example, about 0.01 millimeters (mm) to about 1 mm. The substrate may however be considerably thicker, for example, when a self-supporting article is desired. Such articles can conveniently also be made by laminating or otherwise joining a disclosed film made using a flexible substrate to a thicker, inflexible, or less flexible supplemental support.

In some embodiments, the smoothness and continuity of the first polymer layer (and also each oxide layer and second polymer layer) and its adhesion to the underlying substrate or layer may be enhanced by appropriate pretreatment to the first polymeric film substrate. Examples of a suitable pretreatment regimen include an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric (or inorganic) layer. Plasma pretreatment can be particularly useful.

In some embodiments, a separate tie layer which may have a different composition than the first polymer layer may also be used atop the substrate or an underlying layer to improve adhesion. The adhesion promotion layer can be, for example, a separate polymeric layer or a metal-containing layer such as a layer of metal, metal oxide, metal nitride or metal oxynitride. The tie layer may have a thickness of a few nanometers (nm) (e.g., 1 or 2 nm) to about 50 nm, and can be thicker if desired.

The desired chemical composition and thickness of the first polymer layer will depend in part on the nature and surface topography of the substrate. The thickness typically is sufficient to provide a smooth, defect-free surface to which the subsequent oxide layer can be applied. For example, the first polymer layer may have a thickness of a few nm (e.g., 2 or 3 nm) to about 5 micrometers, and can be thicker if desired.

A major surface of the barrier film is adhered to second polymeric film substrate with a pressure sensitive adhesive according to the present disclosure. The second polymeric film substrate can form the topsheet, for example, in a barrier assembly for a photovoltaic device. Useful materials that can form the top sheet include polyesters, polycarbonates, polyethers, polyimides, polyolefins, fluoropolymers, and combinations thereof.

In embodiments wherein the barrier assembly according to the present disclosure is used, for example, for encapsulating solar devices, it is typically desirable for the top sheet to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The top sheets described herein can provide, for example, a durable, weatherable topcoat for a photovoltaic device. The substrates are generally abrasion and impact resistant and can prevent degradation of, for example, photovoltaic devices when they are exposed to outdoor elements.

A variety of stabilizers may be added to the top sheet to improve its resistance to UV light. Examples of such stabilizers include at least one of ultraviolet absorbers (UVA) (e.g., red shifted UV absorbers), hindered amine light stabilizers (HALS), or anti-oxidants. These additives are described in further detail below. In some embodiments, the phrase "resistant to degradation by ultraviolet light" means that the top sheet includes at least one ultraviolet absorber or hindered amine light stabilizer. In some embodiments, the phrase "resistant to degradation by ultraviolet light" means that the top sheet at least one of reflects or absorbs at least 50 percent of incident ultraviolet light over at least a 30 nanometer range in a wavelength range from at least 300 nanometers to 400 nanometers. In some of these embodiments, the top sheet need not include UVA or HALS.

In some embodiments, the second polymeric film substrate in the assemblies disclosed herein comprises a fluoropolymer. Fluoropolymers typically are resistant to UV degradation even in the absence of stabilizers such as UVA, HALS, and anti-oxidants. Useful fluoropolymers include ethylene-tetrafluoroethylene copolymers (ETFE), tetrafluoroethylene-hexafluoropropylene copolymers (FEP), tetrafluoroethylene-hexafluoropropylene-vinylidene fluoride copolymers (THV), polyvinylidene fluoride (PVDF), blends thereof, and blends of these and other fluoropolymers.

The substrates comprising fluoropolymer can also include non-fluorinated materials. For example, a blend of polyvinylidene fluoride and polymethyl methacrylate can be used. Useful flexible, visible and infrared light-transmissive substrates also include multilayer film substrates. Multilayer film substrates may have different fluoropolymers in different layers or may include at least one layer of fluoropolymer and at least one layer of a non-fluorinated polymer. Multilayer films can comprise a few layers (e.g., at least 2 or 3 layers) or can comprise at least 100 layers (e.g., in a range from 100 to 2000 total layers or more). The different polymers in the different multilayer film substrates can be selected, for example, to reflect a significant portion (e.g., at least 30, 40, or 50%) of UV light in a wavelength range from 300 to 400 nm as described, for example, in U.S. Pat. No. 5,540,978 (Schrenk).

Useful top sheets comprising a fluoropolymer can be commercially obtained, for example, from E.I. duPont De Nemours and Co., Wilmington, Del., under the trade designation "TEFZEL ETFE" and "TEDLAR", from Dyneon LLC, Oakdale, Minn., under the trade designations "DYNEON ETFE", "DYNEON THV", "DYNEON FEP", and "DYNEON PVDF", from St. Gobain Performance Plastics, Wayne, N.J., under the trade designation "NORTON ETFE", from Asahi Glass under the trade designation "CYTOPS", and from Denka Kagaku Kogyo KK, Tokyo, Japan under the trade designation "DENKA DX FILM".

In some embodiments, the second surface of the first polymeric film substrate is attached to the photovoltaic cell with an encapsulant layer. While other encapsulants may be useful, in some embodiments, the encapsulant layer comprises ethylene vinylacetate.

In some embodiments, the PSA layer in the assembly disclosed herein is at least 0.005 mm (in some embodiments, at least 0.01, 0.02, 0.03, 0.04, or 0.05 mm) in thickness. In some embodiments, the PSA layer has a thickness up to about 0.2 mm (in some embodiments, up to 0.15, 0.1, or 0.075 mm) in thickness. For example, the thickness of the PSA layer may be in a range from 0.005 mm to 0.2 mm, 0.005 mm to 0.1 mm, or 0.01 to 0.1 mm.

Not only does the PSA serve as a convenient means for attaching the second polymeric film substrate to the barrier film in the assembly disclosure herein, it is also believed that the PSA layer serves to protect the barrier assembly from thermal stresses that may be caused by CTE mismatch between the second polymeric film substrate, which may be a fluoropolymer, and the first polymeric film substrate on which the barrier film is disposed. The PSA layer according to the present disclosure, which includes an ultraviolet light-absorbing oligomer, further provides protection to the barrier film from degradation by UV light.

The UV resistance of the PSA and the durability of the protection provided can be evaluated, for example, using accelerated weathering studies. Accelerated weathering studies are generally performed on films using techniques similar to those described in ASTM G-155, "Standard practice for exposing non-metallic materials in accelerated test devices that use laboratory light sources". The noted ASTM technique is considered a sound predictor of outdoor durability, that is, ranking materials performance correctly. One mechanism for detecting the change in physical characteristics is the use of the weathering cycle described in ASTM G155 and a D65 light source operated in the reflected mode. Under the noted test, and when the UV protective layer is applied to the article, the article should withstand an exposure of at least 18,700 kJ/m² at 340 nm before the b* value obtained using the CIE L*a*b* space increases by 5 or less, 4 or less, 3 or less, or 2 or less before the onset of significant cracking, peeling, delamination or haze.

Copolymers according to the present disclosure may also be useful, for example, in polymeric films used in outdoor applications. The polymeric film can be, for example, any of the first polymeric film substrates or second polymeric film substrates described above in connection with the barrier film assembly. In addition to barrier films for photovoltaic assemblies, a film that includes the copolymer according to present disclosure can be a top layer of a traffic or other sign, another graphic film (e.g., for building or automotive exteriors), a roofing material or other architectural film, an anti-graffiti film, or a window film. The polymeric film may be a fluoropolymer film including, for example, any of the fluorinated polymers described above and optionally further including non-fluorinated materials (e.g., PMMA).

The copolymer can also be included in one or more layers of a multilayer film. The multilayer film is any film having more than one layer, typically in the thickness direction of the film. For example, the multilayer film may have at least two or three layers up to 10, 15, or 20 layers. In some embodiments, the composition may be included in a mirror film, which may have a layer (or layers) of the composition according to the present disclosure and a metal layer. In some embodiments, the composition can be included in a multilayer optical film (that is, having an optical layer stack), for example, such as those described in U.S. Pat. App. Pub. Nos. 2009/0283144 (Hebrink et al.) and 2012/0011850 (Hebrink et al.). Multi-layer optical films may have, for example, at least 100, 250, 500, or even at least 1000 optical layers. Such multi-layer optical films can be useful as ultraviolet light-reflective mirrors, visible light-reflective mirrors, infrared light-reflective mirrors, or any combination of these (e.g., broadband reflective mirrors). In some of these embodiments, the multilayer optical film reflects at least a major portion of the average light across the range of wavelengths that corresponds with the absorption bandwidth of a selected photovoltaic cell and does not reflect a major portion of the light that is outside the absorption bandwidth of the photovoltaic cell. In other embodiments, the multilayer optical film may be combined with a metal layer to provide a broadband reflector. In some embodiments, the composition according to the present disclosure may be useful, for example, as a retroreflective sheet.

Some Embodiments of the Disclosure

In a first embodiment, the present disclosure provides a copolymer comprising:

first divalent units comprising a pendent ultraviolet absorbing group;

second divalent units represented by formula:

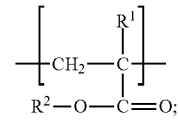

and third divalent units represented by formula:

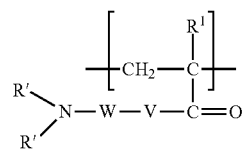

wherein
each $R^1$ is independently hydrogen or methyl;
$R^2$ is a straight-chain or branched alkyl having from 1 to 20 carbon atoms;
V is O or NH;
W is alkylene having from 1 to 10 carbon atoms; and
each R' is independently alkyl having from 1 to 6 carbon atoms.

In a second embodiment, the present disclosure provides the copolymer of the first embodiment, wherein each pendent ultraviolet absorbing group independently comprises a triazine, a benzophenone, or a benzotriazole.

In a third embodiment, the present disclosure provides the copolymer of the first or second embodiment, wherein each first divalent unit is independently represented by formula:

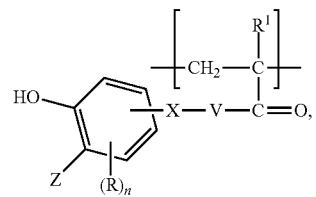

wherein
$R^1$ is independently hydrogen or methyl;
V is O or NH;
X is a bond, alkylene, or alkyleneoxy, wherein the alkylene or alkyleneoxy have from 1 to 10 carbon atoms and are optionally interrupted by one or more —O— groups and optionally substituted by a hydroxyl group;
R is alkyl having from one to four carbon atoms;
n is 0 or 1; and
Z is a benzoyl group optionally substituted by hydroxyl, alkyl, halogen, or hydroxyl; a 4,6-bisphenyl[1,3,5]triazin-2-yl group wherein each phenyl is optionally independently substituted by one or more alkyl or alkoxy groups; or a 2H-benzotriazol-2-yl group optionally substituted by one or more halogens.

In a fourth embodiment, the present disclosure provides the copolymer of the third embodiment, wherein at least some of the first divalent units in the ultraviolet light-absorbing oligomer comprise different Z groups.

In a fifth embodiment, the present disclosure provides the copolymer of any one of the first to fourth embodiments, wherein the third divalent unit is present in the copolymer in an amount of at least one percent by weight, based on the total weight of the copolymer.

In a sixth embodiment, the present disclosure provides the copolymer of any one of the first to fifth embodiments, wherein $R^2$ is a straight-chain or branched alkyl having from 4 to 20 carbon atoms.

In a seventh embodiment, the present disclosure provides the copolymer of the sixth embodiment, wherein $R^2$ is a straight-chain or branched alkyl having from 6 to 12 carbon atoms.

In an eighth embodiment, the present disclosure provides the copolymer of the seventh embodiment, wherein $R^2$ is alkyl having 8 carbon atoms.

In a ninth embodiment, the present disclosure provides a composition comprising a blend of a pressure sensitive adhesive and the copolymer of any one of the sixth to eighth embodiments.

In a tenth embodiment, the present disclosure provides the composition of the ninth embodiment, wherein the pressure sensitive adhesive is an acrylic pressure sensitive adhesive comprising the second divalent units.

In an eleventh embodiment, the present disclosure provides the composition of the tenth embodiment, wherein optionally for at least some of the second divalent units in the pressure sensitive adhesive $R^2$ is alkyl having the same number of carbon atoms as at least some of the second divalent units in the ultraviolet light-absorbing oligomer.

In a twelfth embodiment, the present disclosure the composition of any one of the ninth to eleventh embodiments, wherein the pressure sensitive adhesive further comprises a fourth divalent unit comprising a pendent carboxylic acid group.

In a thirteenth embodiment, the present disclosure provides the composition of any one of the ninth to twelfth embodiments, wherein the copolymer has a number average molecular weight of up to one half the number average molecular weight of the pressure sensitive adhesive.

In a fourteenth embodiment, the present disclosure provides the composition of any one of the ninth to thirteenth embodiments, wherein the copolymer is in the composition in an amount ranging from 0.5 percent to 25 percent by weight, based on the total weight of the composition.

In a fifteenth embodiment, the present disclosure provides the composition of any one of the ninth to thirteenth embodiments, wherein the composition comprises a second, different copolymer comprising the first, second, and third divalent units in the blend, and wherein the first divalent units in the copolymer and in the second, different copolymer comprise different pendent ultraviolet absorbing groups.

In a sixteenth embodiment, the present disclosure provides the composition of the fifteenth embodiment, wherein the copolymer and the second, different copolymer are in the composition in a combined amount ranging from 0.5 percent to 25 percent by weight, based on the total weight of the composition.

In a seventeenth embodiment, the present disclosure provides the composition of any one of the ninth to sixteenth embodiments, wherein the ultraviolet absorbing group is in the composition in an amount ranging from 0.5 weight percent to 20 weight percent, based on the total weight of the composition.

In an eighteenth embodiment, the present disclosure provides an article comprising the composition of any one of the ninth to seventeenth embodiments.

In a nineteenth embodiment, the present disclosure provides the article of the eighteenth embodiment, wherein the article is a photovoltaic device.

In twentieth embodiment, the present disclosure provides the article of the eighteenth or nineteenth embodiment, wherein the composition is disposed on at least a portion of a surface of a film.

In a twenty-first embodiment, the present disclosure provides the article of the twentieth embodiment, wherein the film is at least one of a graphic film, an architectural film, an anti-graffiti film, a window film, or a vehicle wrap.

In a twenty-second embodiment, the present disclosure provides the article of the twentieth embodiment, wherein the film is a barrier film.

In a twenty-third embodiment, the present disclosure provides an article comprising the copolymer of any one of the first to eighth embodiments.

In a twenty-fourth embodiment, the present disclosure provides the article of the twenty-third embodiment, wherein the article is a film.

In a twenty-fifth embodiment, the present disclosure provides the article of the twenty-fourth embodiment, wherein the film is at least one of a graphic film, an architectural film, an anti-graffiti film, a window film, or a vehicle wrap.

In a twenty-sixth embodiment, the present disclosure provides the article of the twenty-fourth embodiment, wherein the film is a multi-layer film.

In a twenty-seventh embodiment, the present disclosure provides an assembly comprising:

a first polymeric film substrate having a first surface and a second surface opposite the first surface;

a barrier film disposed on the first surface of the first polymeric film;

a pressure sensitive adhesive layer having a first surface and a second surface opposite the first surface, wherein the first surface of the pressure sensitive adhesive is disposed on the barrier film opposite the first polymeric film substrate, and wherein the pressure sensitive adhesive composition comprises the composition of any one of the ninth to sixteenth embodiments; and a second polymeric film substrate disposed on the second surface of the pressure sensitive adhesive layer.

In a twenty-eighth embodiment, the present disclosure provides the assembly of the twenty-seventh embodiment, wherein the barrier film comprises at least first and second polymer layers separated by an inorganic barrier layer.

In a twenty-ninth embodiment, the present disclosure provides the assembly of the twenty-eighth embodiment, wherein the inorganic barrier layer is an oxide layer.

In a thirtieth embodiment, the present disclosure provides the assembly of any one of the twenty-seventh to twenty-ninth embodiments, wherein the barrier film comprises a plurality of alternating oxide layers and second polymer layers on the first polymeric film substrate.

In a thirty-first embodiment, the present disclosure provides the assembly of any one of the twenty-seventh to thirtieth embodiments, wherein the first polymeric film substrate comprises at least one of polyethylene terephthalate, polyethylene naphthalate, polyetheretherketone, polyaryletherketone, polyacrylate, polyetherimide, polyarylsulfone, polyethersulfone, polyamideimide, polyimide, ethylene-tetrafluoroethylene copolymer, tetrafluoroethylene-hexafluoropropylene copolymer, tetrafluoroethylene-hexafluoropropylene-vinylidene fluoride copolymer, or polyvinylidene fluoride, any of which may optionally be heat-stabilized.

In a thirty-second embodiment, the present disclosure provides the assembly of any one of the twenty-seventh to thirty-first embodiments, wherein at least one of the first or second polymer layers comprises a polymerized acrylate or methacrylate.

In a thirty-third embodiment, the present disclosure provides the assembly of the thirty-second embodiment, wherein the acrylate or methacrylate is tricyclodecanedimethanol diacrylate, 3-(acryloxy)-2-hydroxy-propylmethacrylate, triacryloxyethyl isocyanurate, glycerol diacrylate, ethoxylated trimethylolpropane diacrylate, pentaerythritol triacrylate, pentaerythritol tetraacrylate, propoxylated (3) glyceryl diacrylate, propoxylated (5,5) glyceryl diacrylate, propoxylated (3) trimethylolpropane diacrylate, propoxylated (6) trimethylolpropane diacrylate, trimethylolpropane diacrylate, trimethylolpropane triacrylate, di-trimethylolpropane tetraacrylate, dipentaerythritol pentaacrylate, or combinations thereof.

In a thirty-fourth embodiment, the present disclosure provides the assembly of any one of the twenty-eighth to thirty-third embodiments, wherein at least one of the first or second polymer layers comprises a siloxane reaction product of an amino-functional silane.

In a thirty-fifth embodiment, the present disclosure provides the assembly of the thirty-fourth embodiment, wherein the siloxane reaction product shares a siloxane bond with the oxide layer.

In a thirty-sixth embodiment, the present disclosure provides the assembly of any one of the twenty-seventh to the thirty-fifth embodiments, wherein the second polymeric film substrate comprises at least one of an ethylene-tetrafluoroethylene copolymer, a tetrafluoroethylene-hexafluoropropylene copolymer, a tetrafluoroethylene-hexafluoropropylene-vinylidene fluoride copolymer, or polyvinylidene fluoride.

In a thirty-seventh embodiment, the present disclosure provides the assembly of any one of the twenty-seventh to thirty-sixth embodiments, wherein second surface of the first polymeric film substrate is disposed on a photovoltaic cell.

In a thirty-eighth embodiment, the present disclosure provides the assembly of the thirty-seventh embodiment, wherein the photovoltaic cell is a CIGS cell.

In thirty-ninth embodiment, the present disclosure provides the assembly of the thirty-seventh or thirty-eighth embodiment, wherein the second surface of the first polymeric film substrate is attached to the photovoltaic cell with an encapsulant layer.

In fortieth embodiment, the present disclosure provides the assembly of the thirty-ninth embodiment, wherein the encapsulant layer comprises ethylene vinylacetate.

In a forty-first embodiment, the present disclosure provides the assembly of any one of the twenty-seventh to fortieth embodiments, wherein the barrier film has at least one of an oxygen transmission rate less than 0.005 g/m$^2$/day at 23° C. and 90% relative humidity or a water vapor transmission rate less than 0.005 g/m$^2$/day at 50° C. and 100% relative humidity.

Embodiments of the compositions and methods disclosed herein are further illustrated by the following examples, but the particular materials and amounts thereof recited in these examples, as well as other conditions and details, should not be construed to unduly limit this invention.

EXAMPLES

Unless otherwise noted, all parts, percentages, ratios, etc. in the examples and the rest of the specification are by weight, and all reagents used in the examples were obtained from general chemical suppliers such as, for example, Alfa Aesar, Ward Hill, Mass.

TABLE 1

Materials

| Designation | Description | Source |
|---|---|---|
| BTZ-MA | 2-[2-hydroxy-5-[2-(methacryloyloxy)-ethyl]phenyl]-2H-benzotriazole | TCI America, Portland, OR |
| IOA | isooctyl acrylate | 3M Co., St. Paul, MN |
| DEAEMA | N,N-diethylaminoethyl methacrylate | BASF, Florham Park, N. J. |
| EtOAc | ethyl acetate | |
| VAZO 67 | 2,2'-azobis(2-methylbutyronitrile) | E.I. du Pont de Nemours and Company, Wilmington, DE |
| DMAA | N,N-dimethylacrylamide | |
| | 4-(4,6-diphenyl-1,3,5-triazin-2-yl)benzene-1,3-diol | Suzhou Rovathin, Jiangsu, China |
| Isobutyl methacrylate | isobutyl methacrylate | |
| Benzyl acrylate | benzyl acrylate | |
| AA | acrylic acid | |
| TINUVIN 123 | A hindered light amine stabilizer ("HALS"), based on an amino ether functionality | BASF |
| TINUVIN 479 | UV absorber: isooctyl 2-[4-[4,6-bis[(1,1'-biphenyl)-4-yl]-1,3,5-triazin-2-yl]-3-hydroxyphenoxy]propanoate | BASF |
| TINUVIN 928 | UV absorber: 2-(2H-benzotriazol-2-yl)-6-(1-methyl-1-phenylethyl)-4-(1,1,3,3-tetramethylbutyl)phenol | BASF |

Test Methods

Molecular Weight Determination

In the following oligomer examples, the molecular weight was determined by comparison to linear polystyrene polymer standards using gel permeation chromatography (GPC). The GPC measurements were carried out on a Waters Reliant e2695 system (obtained from Waters Corporation, Milford, Mass.) using two 300 millimeter (mm) by 7.5 mm linear PL-Gel-2 Columns: one 3 micrometer Mixed-E (nominal MW range up to 30,000 Daltons); and one 5 micrometer Mixed-D (nominal MW range 200-400,000 Daltons). Detection was performed using a Waters Model 2414 evaporative light scattering detector (70° C. drift tube, 30 psi nitrogen flow, 30° C. nebulizer temperature). A 50-milligram (mg) sample of oligomer was dissolved in 10 milliliters (mL) of tetrahydrofuran (inhibited with 250 ppm of BHT) and filtered through a 0.45 micrometer syringe filter. A sample volume of 30 microliters was injected onto the column, and the column temperature was 40° C. A flow rate of 1 mL/minute was used, and the mobile phase was tetrahydrofuran. Molecular weight calibration was performed using narrow dispersity polystyrene standards with peak average molecular weights ranging from $4.8\times10^5$ grams per mole to 580 grams per mole. Calibration and molecular weight distribution calculations were performed using suitable GPC software using a third order polynomial fit for the molecular weight calibration curve. Each reported result was an average of duplicate injections.

Haze Measurement

Haze measurements were performed according to ASTM D1003-13 (November 2013), using a BYK HAZE GUARD PLUS haze meter. (BYK-Gardner USA, Columbia, Md.).

Accelerated Ultraviolet Light Exposure

Films were weathered in continuous xenon arc radiation using Daylight filters as defined in ASTM G155. Irradiance was set at 1.3 $W/m^2/nm$ at 340 nm. The Black Panel Temperature was set at 70° C., and the chamber temperature was set at 47° C. The relative humidity was set at 30%. No water spray was used. Samples were evaluated prior to any exposure to these accelerated weathering conditions, and at total UV dosage of about 662 $MJ/m^2$ for evaluation.

Preparative Example 1 ("PE-1")

2-[4-(4,6-Diphenyl)-[1,3,5]triazin-2-yl]-3-hydroxyphenoxy}-ethyl prop-2-enoate

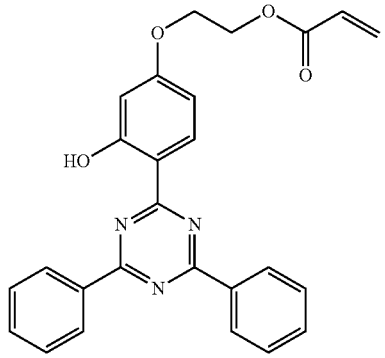 [SMILES: C=CC(=O)OCCOc1ccc(-c2nc(-c3ccccc3)nc(-c3ccccc3)n2)c(O)c1]

Part A

A two liter 3-neck round bottom flask was equipped with a temperature probe, condenser and mechanical stirrer. The flask was charged with 400 grams (1.17 moles) of 4-(4,6-diphenyl-1,3,5-triazin-2-yl)benzene-1,3-diol, 115.5 grams (1.31 moles) of ethylene carbonate, 16.7 grams (0.085 moles) tetraethylammonium bromide and 440 grams of dimethyl formamide (DMF). The batch was heated to 150° C. and maintained at that temperature for five hours. The evolution of $CO_2$ from the batch was observed. After five hours, 10 grams additional ethylene carbonate were added. The batch was heated at 150° C. for three hours, and then 15 grams additional ethylene carbonate and 2 grams additional tetraethylammonium bromide were added. The batch was heated at 150° C. for three more hours, after which time no more starting material was observed by thin layer chromatography.

The batch was allowed to cool to 80° C., and 730 grams of isopropanol (IPA) was added. The mixture was thick, and a mixture of 50/50 IPA/water was added to improve stirring. The solid product was then collected by filtration onto a Buchner funnel. The solid product was taken up into 2500 grams of DMF, heated at reflux, cooled to room temperature, and collected by filtration onto a Buchner funnel. The product was air-dried to give 373 grams (83%) of an off-white solid product 2-(4,6-diphenyl-1,3,5-triazin-2-yl)-5-(2-hydroxyethoxy)phenol.

Part B

A two liter 3-neck round bottom flask was equipped with a temperature probe, Dean-Stark trap with condenser, and mechanical stirrer. The flask was charged with 150 grams (0.389 moles) of 2-(4,6-diphenyl-1,3,5-triazin-2-yl)-5-(2-hydroxyethoxy)phenol, prepared in Part A, 790 grams of toluene, 0.24 grams of 4-methoxyphenol (MEHQ) inhibitor, 0.38 grams of phenothiazine inhibitor, 8.5 grams of p-toluene sulfonic acid, and 30.8 grams (0.43 mole) of acrylic acid. The batch was heated with medium agitation at reflux (about 115° C.) for six hours, and the azeotroped water was collected in the Dean-Stark trap. After five hours, five grams additional acrylic acid was added, and the batch was heated for three more hours. Analysis by thin layer chromatography eluting with 50/50 ethyl acetate/hexanes showed the batch had no residual starting material.

The batch was allowed to cool to 80° C., and 65 grams of triethylamine was added. The batch was heated at reflux at atmospheric pressure to remove most of the toluene. The pot temperature was 120° C., and about 650 grams of toluene were collected. The batch was allowed to cool to 75° C., and 500 grams IPA were added. The mixture was heated at reflux (about 82° C.) to azeotrope off the toluene and IPA. About 500 grams of solvent were collected. The reaction mixture was cooled to about 20° C. with an ice bath, and 500 grams of IPA were added with stirring. The precipitated product was collected by filtration on a Buchner funnel. The solid was taken back up in a mixture of 700 grams water and 700 grams IPA, and the mixture was stirred well and filtered. The product was air-dried to give 161.8 grams (95%) of the light yellow solid product, mp=125° C.-127° C.

To further purify, about 90 grams of the light yellow solid was combined with 1200 grams MEK and heated to 40° C. Five grams of charcoal was added, and the mixture was stirred well and filtered through a bed of filter aid. The solvent was removed using a rotary evaporator, and then 400 grams IPA was added. The mixture was stirred well, and the solid product 2-[4-(4,6-diphenyl)-[1,3,5]triazin-2-yl]-3-hydroxy-phenoxy}-ethyl prop-2-enoate, was collected by filtration, mp=126° C. to 128° C. The structure was confirmed by $^1$H NMR spectroscopy.

Illustrative Oligomer Example 1 ("IOE-1"):
Random Copolymer of 80% by Weight IOA, 10% by Weight Preparative Example 1, and 10% by Weight BTZ-MA IOA (8 g) was mixed with 1 g of Preparative Example 1, 1 g of BTZ-MA, 0.05 g of VAZO 67, and 30 g of EtOAc in a 0.5 pint (~240 mL) bottle. The contents of the bottle were sparged with nitrogen for one minute and the bottle was then sealed with a cap and tape. The bottle was then placed in a launderometer and agitated at 65° C. for 20 hours.

Example 1 and Illustrative Oligomer Examples 2 to 4 ("IOE-2 to IOE-5")

Using the same polymerization conditions as in IOE-1, Example 1 and Illustrative Oligomer Examples 2 to 4 were prepared as random copolymers of 70% by weight IOA, 10% by weight Preparative Example 1, 10% by weight BTZ-MA, and 10% by weight of an added monomer, according the materials and amounts listed in Table 2, below.

TABLE 2

| Example | PE-1, grams | BTZ-MA, grams | IOA, grams | Added monomer (grams) | VAZO 67, grams | EtOAc, grams |
|---|---|---|---|---|---|---|
| IOE-1 | 1 | 1 | 8 | none | 0.05 | 30 |
| Ex. 1 | 1 | 1 | 7 | DEAEMA (1) | 0.05 | 30 |
| IOE-2 | 1 | 1 | 7 | Isobutyl methacrylate (1) | 0.05 | 30 |
| IOE-3 | 1 | 1 | 7 | Benzyl acrylate (1) | 0.05 | 30 |
| IOE-4 | 1 | 1 | 7 | Acrylic acid (1) | 0.05 | 30 |

Example 2 and Comparative Examples A to D: Preparation of "UVA in PSA"

To obtain "UVA in PSA" samples, the solutions of Example 1 and IOE-1 to IOE-4 were each blended into in a solvent-based pressure sensitive adhesive (PSA) composition comprising 94/6 isooctyl acrylate/acrylic acid at 45% solids. The pressure sensitive adhesive composition was prepared as described in U.S. Pat. No. RE24906. 4% active UVA in the composition was targeted.

Example 1 and IOE-1 to IOE-4 are 25% solids in ethyl acetate. These were added to the wet PSA in the glass jar and contents were mixed vigorously with an air mixer for 2 minutes. No crosslinker or other additives were added. After mixing, the contents were left to sit overnight for degassing. These "UVA in PSA" samples of Example 1 and IOE-1 to IOE-4 in the PSA were visually inspected for haze and/or cloudiness, with results as summarized in Table 3, below.

TABLE 3

| Example | Preparative Oligomer | Type of added monomer | Additive % by weight of Oligomer | UVA in PSA, weight percent | Visual appearance of UVA in PSA |
|---|---|---|---|---|---|
| Comparative Example A | IOE-1 | none | 0 | 4 | hazy, cloudy |
| Example 2 | Ex. 1 | DEAEMA | 10 | 4 | clear |
| Comparative Example B | IOE-2 | Isobutyl MA | 10 | 4 | hazy, cloudy |
| Comparative Example C | IOE-3 | BenzylA | 10 | 4 | hazy, cloudy |
| Comparative Example D | IOE-4 | AA | 10 | 4 | hazy, cloudy |

Oligomer Examples 3 to 10: DEAEMA as Added Monomer

Additional Oligomer Examples were prepared using the same polymerization procedure as in Example 1, using materials and amounts indicated in Table 4, below, and including DEAEMA as added monomer.

TABLE 4

| Sample | PE-1, grams | BTZ-MA, grams | IOA, grams | DEAEMA, grams | VAZO 67, grams | EtOAc, grams |
|---|---|---|---|---|---|---|
| Ex. 3 | 1 | 1 | 7 | 1 | 0.05 | 30 |
| Ex. 4 | 1 | 1 | 7.9 | 0.1 | 0.05 | 30 |
| Ex. 5 | 1 | 1 | 7.75 | 0.25 | 0.05 | 30 |
| Ex. 6 | 1 | 1 | 7.5 | 0.5 | 0.05 | 30 |
| Ex. 7 | 2 | 0 | 7 | 1 | 0.05 | 30 |
| Ex. 8 | 1 | 1 | 7.9 | 0.1 | 0.05 | 30 |

TABLE 4-continued

| Sample | PE-1, grams | BTZ-MA, grams | IOA, grams | DEAEMA, grams | VAZO 67, grams | EtOAc, grams |
|---|---|---|---|---|---|---|
| Ex. 9 | 1 | 1 | 7.95 | 0.05 | 0.05 | 30 |
| Ex. 10 | 2 | 0 | 7.9 | 0.1 | 0.05 | 30 |

*Example 3 and Example 1 have the same formulation

The molecular weights of Ex-4 and Ex-7 oligomers were measured by the GPC method described above, with the results summarized in Table 5 ($M_w$=weight average molecular weight; $M_n$=number average molecular weight; all values in Daltons).

TABLE 5

| Sample | $M_W$ | $M_n$ | Polydispersity |
|---|---|---|---|
| Ex 4 | 90590 | 58290 | 1.55 |
| Ex 7 | 19933 | 14900 | 1.3 |

Examples 11 to 18: UVA in PSA with DEAEMA as Added Monomer

Samples of Oligomer Examples 3 to 10 were blended into PSA using the same procedure described above for the preparation of Example 2, and these "UVA in PSA" Examples 11-18 were visually inspected for haze and/or cloudiness, with results as summarized in Table 6. Either 4% or 10% active UVA in the composition was targeted, with 16% active UVA added in Example 11.

TABLE 6

| Example | Preparative Oligomer | Type of added monomer | DEAEMA % by weight of Oligomer | UVA in PSA, weight percent | Visual appearance of UVA in PSA |
|---|---|---|---|---|---|
| Example 11 | Ex. 3 | DEAEMA | 10 | 16 | clear |
| Example 12 | Ex. 4 | DEAEMA | 1 | 10 | clear |
| Example 13 | Ex. 5 | DEAEMA | 2.5 | 10 | clear |
| Example 14 | Ex. 6 | DEAEMA | 5 | 10 | clear |
| Example 15 | Ex. 7 | DEAEMA | 10 | 10 | clear |
| Example 16 | Ex. 8 | DEAEMA | 1 | 4 | clear |
| Example 17 | Ex. 9 | DEAEMA | 0.5 | 4 | cloudy, milky |
| Example 18 | Ex. 10 | DEAEMA | 1 | 4 | cloudy, milky |

**Example 2 and Example 11 differ from each other in weight percent of UVA in PSA.

Illustrative Oligomer Examples 5 to 9: DMAA as Added Monomer

Additional Illustrative Oligomer Examples were prepared using the same polymerization procedure as in Example 1, using materials and amounts indicated in Table 7, below, and including DMAA as added monomer.

TABLE 7

| Sample | PE-1, grams | BTZ-MA, grams | IOA, grams | DMAA, grams | VAZO 67, grams | EtOAc, grams |
|---|---|---|---|---|---|---|
| IOE-5 | 1 | 1 | 7 | 1 | 0.05 | 30 |
| IOE-6 | 1 | 1 | 7.9 | 0.1 | 0.05 | 30 |
| IOE-7 | 1 | 1 | 7.75 | 0.25 | 0.05 | 30 |
| IOE-8 | 1 | 1 | 7.5 | 0.5 | 0.05 | 30 |
| IOE-9 | 2 | 0 | 7 | 1 | 0.05 | 30 |

Illustrative Examples 10 to 14: UVA in PSA with DMAA as Added Monomer

Several illustrative examples were provided by blending samples of IOE-5 to IOE-9 into PSA using the same procedure described above for the preparation of Example 2, and these "UVA in PSA" Illustrative Examples were visually inspected for haze and/or cloudiness, with results as summarized in Table 8. 4% active UVA in the composition was targeted.

TABLE 8

| Example | Preparative Oligomer | Type of added monomer | Additive % by weight of Oligomer | UVA in PSA, weight percent | Visual appearance of UVA in PSA |
|---|---|---|---|---|---|
| Illustrative Example 10 | IOE-5 | DMAA | 10 | 4 | cloudy, milky |
| Illustrative Example 11 | IOE-6 | DMAA | 1 | 4 | cloudy, milky |
| Illustrative Example 12 | IOE-7 | DMAA | 2.5 | 4 | cloudy, milky |
| Illustrative Example 13 | IOE-8 | DMAA | 5 | 4 | cloudy, milky |
| Illustrative Example 14 | IOE-9 | DMAA | 10 | 4 | cloudy, milky |

Haze Measurement of UVA in PSA Samples

Samples of UVA in PSA were prepared as follows. UVA material and "TINUVIN 123" were dissolved in toluene, and subsequently were added to the PSA composition described in Example 2 in a clear glass jar, using the relative weight percent amounts of materials indicated in Table 9. The mixtures were made as 100 gram batches and incorporated by rolling at 40 rpm for 10 minutes. A bis-amide crosslinker (0.2% by weight, based on the weight of the PSA and crosslinker) of the type described U.S. Pat. No. 6,777,079 (Zhou et al.) was added to the mixture and the mixture was then allowed to roll at 40 rpm for another 20 minutes. The weight percent of the UVA is the weight percent of the active UVA.

TABLE 9

| Sample | UVA type* | UVA % by weight | TINUVIN 123, % by weight |
|---|---|---|---|
| Example 19 | Ex. 4 | 10 | 1 |
| Example 20 | Ex. 7 | 10 | 1 |
| Comparative Example E | TINUVIN 928 | 10 | 1 |
| Comparative Example F | TINUVIN 479 | 10 | 1 |
| Comparative Example G | IOE-1 | 10 | 1 |

*See Table 4 for composition of Ex. 4 and Ex. 7; both have DEAEMA as added monomer The mixtures were then knife coated onto a PET release liner to a thickness of 2 mil (~51 micrometers) and placed in a 250° F. (121° C.) oven for 5 minutes to cure. The samples were then removed from the PET release liners and hand laminated between two 1 mil (~25 micrometer) poly(ethene-co-tetrafluoroethene) ("ETFE") films Saint-Gobain for analysis.

The UVA in PSA samples summarized in Table 9 were analyzed for Haze Measurement as described above, with results as summarized in Table 10.

TABLE 10

| Sample | Haze value (n = 5) |
|---|---|
| Example 19 | 4.84 |
| Example 20 | 8.74 |
| Comparative Example E | 86.6* |
| Comparative Example F | 5.4 |
| Comparative Example G | 11.31 |

*TINUVIN 479 exhibited poor solubility

Degradation Study

Samples were prepared according to the description for the samples in Table 9, with the modifications that the percent active UVA for Examples 19 and 20 and Comparative Example E was 1%, and the percent active UVA for Comparative Example F was 2%. These laminates were studied in the Accelerated Ultraviolet Light Exposure test method described above. Absorbance measurements were taken at regular intervals during this weathering and the absorbance peak at 350 nm was monitored as a function of UV dosage. Slope was determined as a function of absorbance at 350 nm versus light dosage, with results as summarized in Table 11.

Degradation rates of the various UVAs were determined via first order kinetics as outlined by James E. Pickett in "UV Absorber Permanence and Coating Lifetimes" *Journal of Testing and Evaluation*, 2004, Vol. 32 No 3. "When absorbance of a film or coating is measured as a function of light dosage, plotting log(10^(Abs)) vs exposure should give a straight line with slope k".

TABLE 11

| Sample | Average slope (n = 4) | Standard Deviation |
|---|---|---|
| Example 19 | −7.50E−04 | 5.77E−05 |
| Example 20 | −2.00E−04 | 0 |
| Comparative Example E | −6.75E−04 | 9.57E−05 |
| Comparative Example F | −1.38E−03 | 5.00E−05 |

Example 7 exhibited a significantly decreased degradation rate when compared to commercial UVAs. While Example 4 is roughly equivalent in degradation rate to "TINUVIN 479", it is far more compatible with the PSA composition than "TINUVIN 479", far better in degradation rate in comparison to "TINUVIN 928".

Various modifications and alterations of this disclosure may be made by those skilled the art without departing from the scope and spirit of the disclosure, and it should be understood that this invention is not to be unduly limited to the illustrative embodiments set forth herein.

What is claimed is:

1. A copolymer comprising:
   first divalent units independently represented by formula:

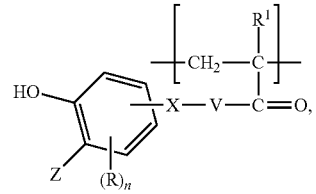

wherein
   X is a bond, alkylene, or alkyleneoxy, wherein the alkylene or alkyleneoxy have from 1 to 10 carbon atoms and are optionally interrupted by one or more —O— groups and optionally substituted by a hydroxyl group;
   R is alkyl having from one to four carbon atoms;
   n is 0 or 1; and
   Z is a 4,6-bisphenyl[1,3,5]triazin-2-yl group wherein each phenyl is optionally independently substituted by one or more alkyl or alkoxy groups;
   second divalent units represented by formula:

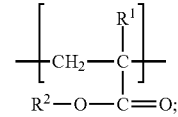

and
   third divalent units represented by formula:

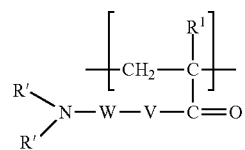

wherein
   each $R^1$ is independently hydrogen or methyl;
   $R^2$ is a straight-chain or branched alkyl having from 1 to 20 carbon atoms;
   each V is independently O or NH;
   W is alkylene having from 1 to 10 carbon atoms; and
   each R' is independently alkyl having from 1 to 6 carbon atoms.

2. The copolymer of claim 1, further comprising further first divalent units with pendent ultraviolet absorbing groups comprising a benzophenone or a benzotriazole.

3. The copolymer of claim 2, wherein each of the further first divalent units is independently represented by formula:

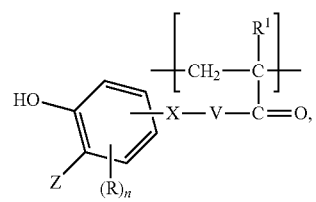

wherein
- $R^1$ is independently hydrogen or methyl;
- V is O or NH;
- X is a bond, alkylene, or alkyleneoxy, wherein the alkylene or alkyleneoxy have from 1 to 10 carbon atoms and are optionally interrupted by one or more —O— groups and optionally substituted by a hydroxyl group;
- R is alkyl having from one to four carbon atoms;
- n is 0 or 1; and
- Z is a benzoyl group optionally substituted by alkyl, halogen, or hydroxyl or a 2H-benzotriazol-2-yl group optionally substituted by one or more halogens.

4. The copolymer of claim 1, wherein at least some of the first divalent units in the copolymer comprise different pendent ultraviolet absorbing groups.

5. The copolymer of claim 1, wherein the third divalent unit is present in the copolymer in an amount of at least one percent by weight, based on the total weight of the copolymer.

6. The copolymer of claim 1, wherein $R^2$ is a straight-chain or branched alkyl having from 4 to 20 carbon atoms.

7. A composition comprising a blend of a pressure sensitive adhesive and the copolymer of claim 6.

8. The composition of claim 7, wherein the pressure sensitive adhesive is an acrylic pressure sensitive adhesive comprising the second divalent units.

9. The composition of claim 8, wherein the pressure sensitive adhesive further comprises a fourth divalent unit comprising a pendent carboxylic acid group.

10. The composition of claim 7, wherein the copolymer has a number average molecular weight of up to one half the number average molecular weight of the pressure sensitive adhesive.

11. The composition of claim 7, wherein the copolymer is in the composition in an amount ranging from 0.5 percent to 25 percent by weight, based on the total weight of the composition.

12. The composition of claim 7, wherein the composition comprises a second, different copolymer comprising the first, second, and third divalent units in the blend, and wherein the first divalent units in the copolymer and in the second, different copolymer comprise different pendent ultraviolet absorbing groups.

13. An article comprising the composition of claim 7 disposed on at least a surface thereof, wherein the article is a photovoltaic device, vehicle wrap, graphic film, anti-graffiti film, architectural film, a barrier film, or window film.

14. An assembly comprising:
- a first polymeric film substrate having a first surface and a second surface opposite the first surface;
- a barrier film disposed on the first surface of the first polymeric film;
- a pressure sensitive adhesive layer having a first surface and a second surface opposite the first surface, wherein the first surface of the pressure sensitive adhesive layer is disposed on the barrier film opposite the first polymeric film substrate, and wherein the pressure sensitive adhesive layer comprises the composition of claim 7; and
- a second polymeric film substrate disposed on the second surface of the pressure sensitive adhesive layer.

15. The assembly of claim 14, wherein the assembly is disposed on a photovoltaic cell.

16. The article of claim 13, wherein the article is a barrier film.

17. The composition of claim 12, wherein the copolymer and the second, different copolymer are in the composition in a combined amount ranging from 0.5 percent to 25 percent by weight, based on the total weight of the composition.

18. The composition of claim 8, wherein for at least some of the second divalent units in the pressure sensitive adhesive, $R^2$ is alkyl having the same number of carbon atoms as at least some of the second divalent units in the ultraviolet light-absorbing oligomer.

19. The copolymer of claim 1, wherein $R^2$ is a straight-chain or branched alkyl having from 6 to 12 carbon atoms.

20. The copolymer of claim 1, wherein $R^2$ is alkyl having 8 carbon atoms.

* * * * *

UNITED STATES PATENT AND TRADEMARK OFFICE
CERTIFICATE OF CORRECTION

PATENT NO. : 10,519,350 B2
APPLICATION NO. : 15/739073
DATED : December 31, 2019
INVENTOR(S) : David Olson et al.

It is certified that error appears in the above-identified patent and that said Letters Patent is hereby corrected as shown below:

In the Specification

Column 6
Line 27, delete "$R^1$" and insert -- R' --, therefor.
Line 31, delete "$R^1$" and insert -- R' --, therefor.
Line 32, delete "$R^1$" and insert -- R' --, therefor.

Column 7
Line 23, delete "-acryoyloxyethoxy)]-" and insert -- -acryloyloxyethoxy)]- --, therefor.
Line 53, delete "—C(R')=" and insert -- —C($R^1$)= --, therefor.

Column 8
Lines 25-29, after 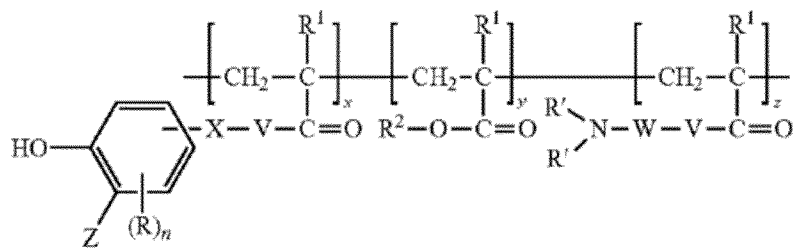 insert -- . --.

Signed and Sealed this
First Day of December, 2020

Andrei Iancu
*Director of the United States Patent and Trademark Office*